US012640220B2

(12) United States Patent
Hirano et al.

(10) Patent No.: US 12,640,220 B2
(45) Date of Patent: May 26, 2026

(54) BIT COUNTING CIRCUITS AND MEMORY DEVICES INCLUDING THE SAME

(71) Applicant: Samsung Electronics Co., Ltd., Suwon-si (KR)

(72) Inventors: Makoto Hirano, Suwon-si (KR); Jongmin Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 18/406,424

(22) Filed: Jan. 8, 2024

(65) Prior Publication Data

US 2024/0233852 A1     Jul. 11, 2024

(30) Foreign Application Priority Data

Jan. 11, 2023   (KR) ......................... 10-2023-0004324
May 3, 2023    (KR) ......................... 10-2023-0057774

(51) Int. Cl.
| | |
|---|---|
| *G11C 29/10* | (2006.01) |
| *G11C 7/10* | (2006.01) |
| *G11C 29/12* | (2006.01) |
| *G11C 29/20* | (2006.01) |
| *G11C 29/32* | (2006.01) |

(52) U.S. Cl.
CPC ............ *G11C 29/32* (2013.01); *G11C 7/1036* (2013.01); *G11C 29/1201* (2013.01); *G11C 29/20* (2013.01)

(58) Field of Classification Search
CPC ... G11C 29/32; G11C 7/1036; G11C 29/1201; G11C 29/20; G11C 29/44
See application file for complete search history.

(56) References Cited

U.S. PATENT DOCUMENTS

| | | | |
|---|---|---|---|
| 8,427,884 | B2 | 4/2013 | Liu et al. |
| 10,402,247 | B2 | 9/2019 | Lim et al. |
| 11,004,522 | B2 | 5/2021 | Nakayama |
| 11,475,972 | B2 | 10/2022 | Yang et al. |
| 11,581,028 | B2 | 2/2023 | Chai |
| 2016/0314041 | A1* | 10/2016 | Cha ......................... G11C 29/44 |
| 2018/0144813 | A1* | 5/2018 | Hong ..................... G11C 29/26 |
| 2020/0379678 | A1 | 12/2020 | Kim |

(Continued)

FOREIGN PATENT DOCUMENTS

| | | |
|---|---|---|
| JP | 2020202003 A | 12/2020 |
| KR | 20170085779 A | 7/2017 |

(Continued)

*Primary Examiner* — Mohammed A Bashar
(74) *Attorney, Agent, or Firm* — Wolf, Greenfield & Sacks, P.C.

(57) ABSTRACT

A nonvolatile memory device includes a control logic configured to generate a clock signal and a page buffer selection signal including information about a ratio of a number of page buffers on which a fail bit counting operation is performed to a total number of the plurality of page buffers, a fail bit counting circuit configured to select one or more page buffers from among the plurality of page buffers, repeat the fail bit counting operation on the selected one or more page buffers, and output a value of a number of fail bits with respect to the page buffers on which the fail bit counting operation is performed, and a predictor configured to generate a prediction value with respect to a total number of fail bits with respect to the plurality of page buffers.

20 Claims, 25 Drawing Sheets

10

200

100

MEMORY CONTROLLER

CMD

ADDR

DATA

MEMORY DEVICE

110
MEMORY CELL ARRAY

120
PAGE BUFFER BLOCK

600
PREDICTION-BASED FAIL BIT COUNTER

650
PAGE BUFFER SELECTION CONTROL CIRCUIT

(56) References Cited

U.S. PATENT DOCUMENTS

2020/0411086 A1* 12/2020 Yim ....................... G11C 16/10
2021/0303188 A1    9/2021 Bazarsky et al.

FOREIGN PATENT DOCUMENTS

KR      20200136743 A    12/2020
KR      20220080790 A     6/2022
KR      20220118236 A     8/2022

* cited by examiner

620_0

SCAN REGISTER CHAIN LENGTH = 16

[1ST SECTION]

[2ND SECTION]

BIT COUNTING CIRCUITS AND MEMORY DEVICES INCLUDING THE SAME

CROSS-REFERENCE TO RELATED APPLICATIONS

This application is based on and claims priority under 35 U.S.C. § 119 to Korean Patent Application No. 10-2023-0004324, filed on Jan. 11, 2023, and to Korean Patent Application No. 10-2023-0057774, filed on May 3, 2023, in the Korean Intellectual Property Office, and the entire contents of each above-identified application are incorporated by reference herein.

TECHNICAL FIELD

The inventive concept relates to memory devices, and more particularly, to fail bit counting circuits configured to count a number of fail bits and to memory devices including the fail bit counting circuits.

BACKGROUND

A semiconductor memory device is a memory device including a semiconductor, such as Si, Ge, GaAs, InP, etc. Semiconductor memory devices can be largely divided into volatile memory devices and nonvolatile memory devices.

Particularly, a nonvolatile memory device, such as a flash memory device, has advantages, such as a high operation speed, low power consumption, reduced noise, a high capacity, etc., and is used in various fields. In order to identify a program state of memory cells, the nonvolatile memory device may count off cells (or on cells) of the memory cells by using a predetermined verification voltage. Based on the number of counted off cells, the nonvolatile memory device may identify a threshold voltage distribution shape of the memory cells, the characteristics of the memory cells, etc., and based on the identified threshold voltage distribution shape and characteristics of the memory cells, the nonvolatile memory device may perform a memory operation such as a program operation, a read operation, etc.

Also, with respect to a predetermined memory operation, it may be desirable to identify accurately the threshold voltage distribution shape of the memory cells, the characteristics of the memory cells, etc. Therefore, research has been conducted into a nonvolatile memory device that is configured to count the number of "0" or "1," which is a sensing result output by a page buffer for identifying accurately the number of on cells and the number of off cells under a predetermined voltage condition or the number of cells existing in a predetermined voltage section.

SUMMARY

The inventive concepts provide a fail bit counting circuit configured to count the number of fail bits and a memory device including the fail bit counting circuit. Also, the inventive concepts provide an operating method of each of a fail bit counting circuit and a memory device including the fail bit counting circuit.

According to some aspects of the inventive concept, there is provided a nonvolatile memory device including a memory cell array including a plurality of memory cells, a plurality of page buffers connected to the memory cell array through bit lines, a control logic configured to generate a clock signal and a page buffer selection signal including information about a ratio of a number of page buffers on which a fail bit counting operation is performed to a total number of the plurality of page buffers, a fail bit counting circuit configured to select, based on the clock signal and the page buffer selection signal, one or more page buffers from among the plurality of page buffers, repeat, based on a shift register, the fail bit counting operation on the selected one or more page buffers, and output a value of a number of fail bits with respect to the page buffers on which the fail bit counting operation is performed based on the repetition, and a predictor configured to generate, based on the ratio of the number of page buffers on which the fail bit counting operation is performed to the total number of the plurality of page buffers and based on the number of fail bits with respect to the page buffers on which the fail bit counting operation is performed, a prediction value with respect to a total number of fail bits with respect to the plurality of page buffers.

According to some aspects of the inventive concepts, there is provided a nonvolatile memory device including a memory cell array including a plurality of memory cells, a plurality of page buffers connected to the memory cell array through bit lines, a control logic configured to generate a clock signal, a page buffer selection signal control circuit configured to generate a page buffer selection signal including information about a ratio of a number of page buffers on which a fail bit counting operation is performed to a total number of the plurality of page buffers, a fail bit counting circuit configured to select, based on the clock signal and the page buffer selection signal, one or more page buffers from among the plurality of page buffers, repeat, based on a shift register, the fail bit counting operation on the selected one or more page buffers, and output a value of a number of fail bits with respect to the page buffers on which the fail bit counting operation is performed based on the repetition, and a predictor configured to generate, based on the ratio of the page buffers on which the fail bit counting operation is performed to the plurality of page buffers and based on the number of fail bits with respect to the page buffers on which the fail bit counting operation is performed, a prediction value with respect to a total number of fail bits with respect to the plurality of page buffers.

According to some aspects of the inventive concept, there is provided an operating method of a nonvolatile memory device including a plurality of page buffers, the operating method including selecting one or more page buffers from among the plurality of page buffers and repeating a fail bit counting operation on the selected one or more page buffers based on a shift register, generating a value of a number of fail bits with respect to the page buffers on which the fail bit counting operation is performed based on the repetition, and generating, based on a ratio of a number of the page buffers on which the fail bit counting operation is performed to a total number of the plurality of page buffers and based on the number of fail bits with respect to the page buffers on which the fail bit counting operation is performed, a prediction value with respect to a total number of fail bits with respect to the plurality of page buffers.

BRIEF DESCRIPTION OF THE DRAWINGS

Embodiments will be more clearly understood from the following detailed description taken in conjunction with the accompanying drawings in which:

FIG. 9B illustrates an operation of a scan register chain at a time point at which data PF is input in FIG. 9A;

FIG. 9C illustrates an operation of a scan register chain at a time point T1 in FIG. 9A;

FIG. 9D illustrates an operation of a scan register chain at a time point T2 in FIG. 9A;

DETAILED DESCRIPTION OF THE EMBODIMENTS

Figure 1:
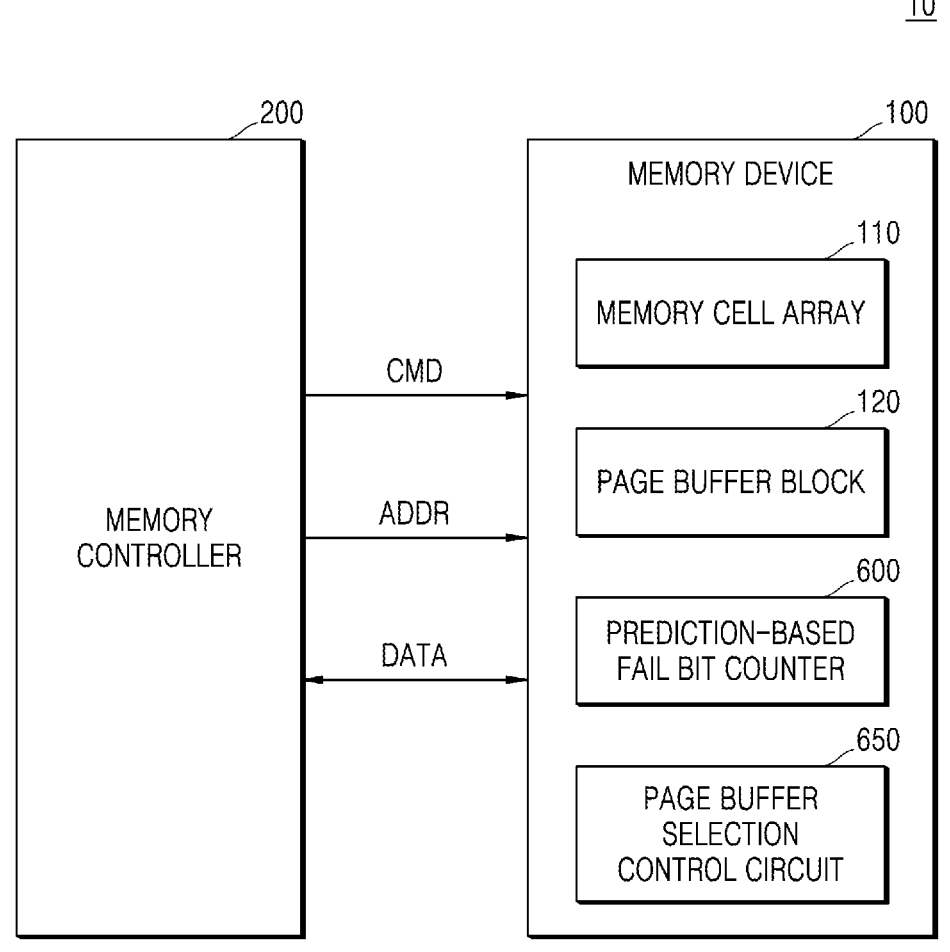
FIG. 1 is a schematic block diagram of a memory system according to some embodiments.

FIG. 1 is a schematic block diagram of a memory system 10 according to some embodiments.

Referring to FIG. 1, the memory system 10 may include a memory device 100 and a memory controller 200. According to some embodiments, the memory system 10 may be realized by one chip, one semiconductor package, or one module. According to some embodiments, each of the memory controller 200 and the memory device 100 may be realized by one chip, one semiconductor package, or one module. The memory system 10 may be used as a storage medium of an external device (for example, a host, an application processor, etc.) that is not shown in FIG. 1. The memory system 10 may be a high capacity storage medium, such as a memory card, a memory stick, and a solid state drive (SSD).

The memory controller 200 may control the memory device 100 according to control by an external device. The memory controller 200 may transmit an address ADDR and a command CMD to the memory device 100 or may transmit and receive data DATA to and from the memory device 100.

The memory device 100 may include a memory cell array 110, a page buffer block 120, a prediction-based fail bit counter 600, and a page buffer selection control circuit 650.

The memory cell array 110 may include a plurality of memory cells. According to some embodiments, the memory cell array 110 may be a NAND flash memory cell array or a NOR flash memory cell array. Hereinafter, some examples of embodiments are described in detail assuming that the plurality of memory cells are NAND flash memory cells. However, the inventive concepts are not limited thereto, and according to some embodiments, the plurality of memory cells may be resistive memory cells, such as resistive random-access memory (PRAM), phase change random-access memory (PRAM), magnetic random-access memory (MRAM), or volatile memory cells, such as dynamic random-access memory (DRAM).

The page buffer block 120 may include a plurality of page buffers (not shown) that are connected to the memory cell array 110 through a plurality of bit lines. After a program operation is performed on the memory cells of the memory cell array 110, a predetermined verity voltage (or read voltage) may be applied, and the page buffer block 120 may receive, through at least one bit line, at least one output from the memory cell array 110 according to the verity voltage.

The prediction-based fail bit counter 600 may perform an operation of counting the number of off cells. According to the inventive concepts, the operation of counting the number of off cells may be referred to as a fail bit counting operation or a mass bit counting operation. Based on a result of a counting operation of the prediction-based fail bit counter 600, the memory device 100 may verify the program operation performed on the memory cell array 110. Also, based on a result of a counting operation of the prediction-based fail bit counter 600, the memory device 100 may perform a program operation by using an incremental step pulse programming (ISPP) method. According to the inventive concepts, it is generally described that the prediction-based fail bit counter 600 counts the number of off cells. However, it is for convenience of explanation, and the inventive concepts are not limited thereto. The prediction-based fail bit counter 600 may count the number of on cells, and based on the counted number of on cells, a memory operation may be performed. That is, the prediction-based fail bit counter 600 may count the number of "0" or "1" values, which may be a sensing result output by a page buffer, in order to identify the number of on cells or the number of off cells under a predetermined voltage condition or the number of cells existing in a predetermined voltage section.

The memory device 100 according to some embodiments may support an accurate or more accurate fail bit counting operation. Thus, accurate or more accurate verification with respect to a program operation may be possible, and thus, the reliability of the program operation of the memory device 100 may be improved.

The memory device 100 according to some embodiments may predict the total number of fail bits by considering information about a progression rate of a fail bit counting operation at a predetermined time point.

The memory device 100 according to some embodiments may count fail bits within a short period of time when the number of fail bits is relatively small. Accordingly, when the number of fail bits is small, a shift register may sample all fail bits, and thus, accuracy may be obtained.

The memory device 100 according to some embodiments may not complete sampling at a predetermined time point, when the number of fail bits is relatively large. Accordingly, the shift register may apply prediction calculation, and because a fail bit rate is high, may perform prediction-based calculation with reduced errors.

Figure 2:
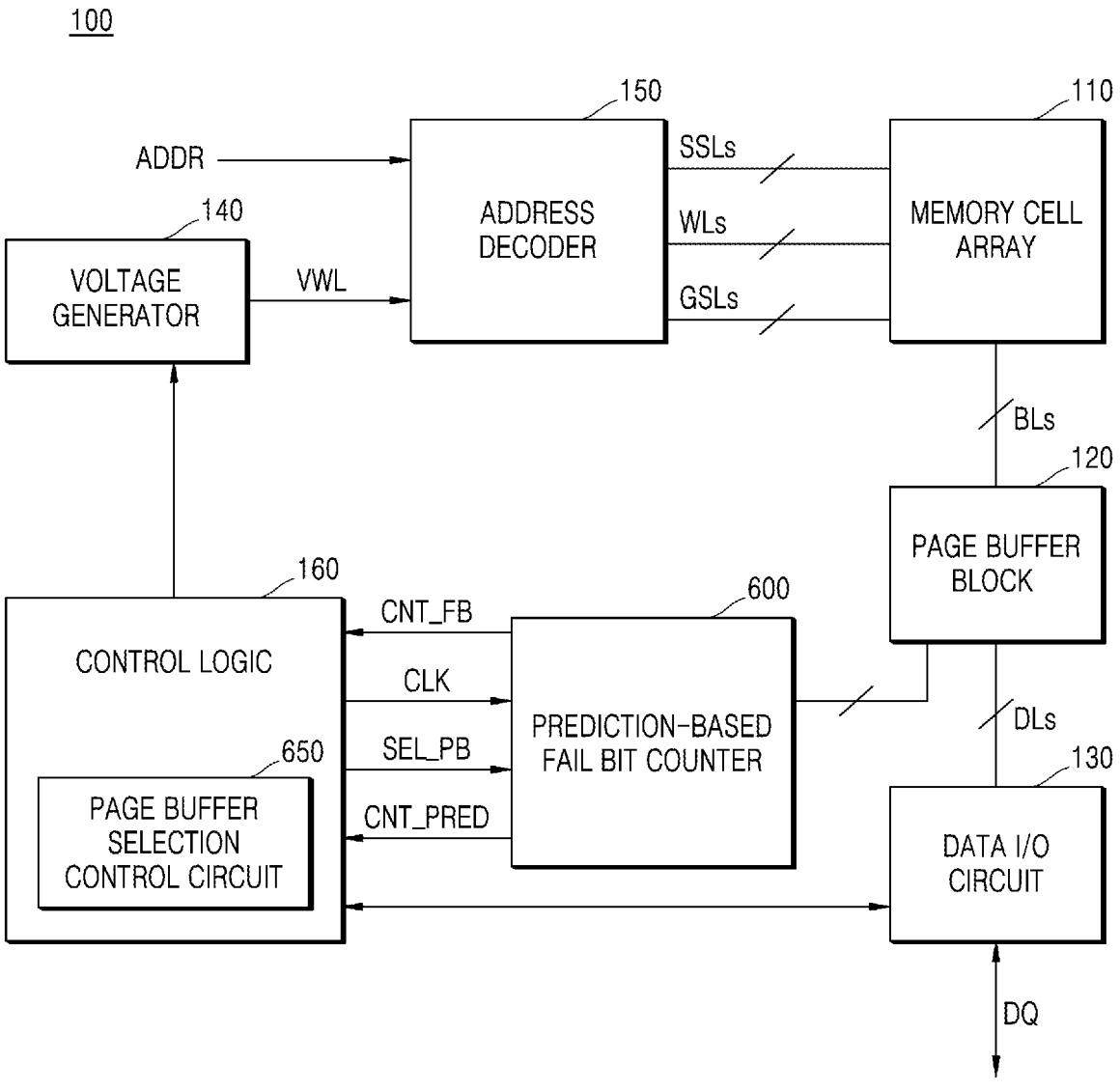
FIG. 2 is a block diagram of a memory device of the memory system of FIG. 1, according to some embodiments.

FIG. 2 is a block diagram of the memory device 100 of the memory system 10 of FIG. 1, according to some embodiments.

Referring to FIG. 2, the memory device 100 may include the memory cell array 110, the page buffer block 120, a data input and output (I/O) circuit 130, a voltage generator 140, an address decoder 150, a control logic 160, and the prediction-based fail bit counter 600.

The memory cell array 110 may be connected to the address decoder 150 through word lines WLs, string select lines SSLs, and ground select lines GSLs and may be connected to the page buffer block 120 through bit lines BLs. The memory cell array 110 may include a plurality of memory blocks. The memory cell array 110 may include a plurality of NAND cell strings. Each cell string may form a channel in a vertical direction or a horizontal direction. The word lines WLs may be stacked in the vertical direction in the memory cell array 110.

The address decoder 150 may select any one of the word lines WLs of the memory cell array 110 by decoding an address ADDR. During a program operation, the address decoder 150 may apply, to a select word line of the memory cell array 110, a program voltage provided from the voltage generator 140. Also, during a verify operation or a read operation, the address decoder 150 may apply, to a select word line of the memory cell array 110, a verify voltage or a read voltage provided from the voltage generator 140. The voltage generator 140 may generate various kinds of voltages for performing a program operation, a read operation, and/or an erase operation, based on voltage control signals. For example, the voltage generator 140 may generate a program voltage, a read voltage, a program verify voltage, an erase voltage, etc. as a word line voltage VWL.

The data I/O circuit 130 may be connected to the page buffer block 120 through data lines DLs and may provide received data DQ (e.g., from an external device) to the page buffer block 120 and/or may output, to the outside (e.g., to an external device), data DQ provided from the page buffer block 120. The data I/O circuit 130 may provide a received command or address to the control logic 160 or the address decoder 150.

The page buffer block 120 may operate as a program driver or a sense amplifier according to an operation performed by the control logic 160. During a program operation, the page buffer block 120 may provide a voltage corresponding to data to be programmed to the bit lines BLs of the memory cell array 110. During a verify operation or a read operation, the page buffer block 120 may sense data programmed in a select memory cell through the bit lines BLs and provided a sensed result to the control logic 160 or the data I/O circuit 130.

The control logic 160 may include at least one of an oscillator (not shown) and the page buffer selection control circuit 650. The control logic 160 may perform verification with respect to a threshold voltage distribution shape of the memory cells of the memory cell array 110 by using the page buffer selection control circuit 650. The page buffer selection control circuit 650 may be arranged outside the control logic 160, and the inventive concepts are not limited to the embodiments described above in which the control logic 160 includes the page buffer selection control circuit 650.

According to some embodiments, the control logic 160 may output a clock signal CLK to a plurality of page buffers, and the control logic 160 may output a page buffer selection signal SEL_PB, which may include information about a ratio of a number of page buffers on which a fail bit counting operation is performed, to a total number of the plurality of page buffers. For example, the oscillator may output the clock signal CLK, and the page buffer selection control circuit 650 may output the page buffer selection signal SEL_PB including the information about the ratio of the number of page buffers on which the fail bit counting operation is performed to the total number plurality of page buffers. The control logic 160 may input the clock signal CLK to the prediction-based fail bit counter 600. The control logic 160 may input the page buffer selection signal SEL_PB to the prediction-based fail bit counter 600.

According to some embodiments, the prediction-based fail bit counter 600 may select one or more page buffers from the page buffer block 120 based on the clock signal CLK and the page buffer selection signal SEL_PB. The prediction-based fail bit counter 600 may perform a fail bit counting operation on the selected one or more page buffers based on a shift register. Also, the prediction-based fail bit counter 600 may repeat the fail bit counting operation. The prediction-based fail bit counter 600 may be configured to output a value CNT_FB of the number of fail bits with respect to the page buffers on which the fail bit counting operation is performed based on the repetition. The prediction-based fail bit counter 600 may output a prediction value CNT_PRED with respect to the total number of fail bits with respect to the page buffer block 120, based on a ratio of the number of page buffers on which the fail bit counting operation is performed to the total number of page buffers of the page buffer block 120 and the number of fail bits with respect to the page buffers on which the fail bit counting operation is performed. The prediction-based fail bit counter 600 may transmit, to the control logic 160, at least one of the value CNT_FB of the number of fail bits with respect to the page buffers on which the fail bit counting operation is performed and the prediction value CNT_PRED with respect to the total number of fail bits. According to some embodiments, the prediction-based fail bit counter 600 may transmit a scan output signal SRC_OUT based on the shift register to the control logic 160, and the control logic 160 may perform the fail bit counting operation on the selected one or more page buffers, based on the scan output signal SRC_OUT. The control logic 160 may repeat the fail bit counting operation and may output the value CNT_FB of the number of fail bits with respect to the page buffers on which the fail bit counting operation is performed based on the repetition.

Figure 3A:
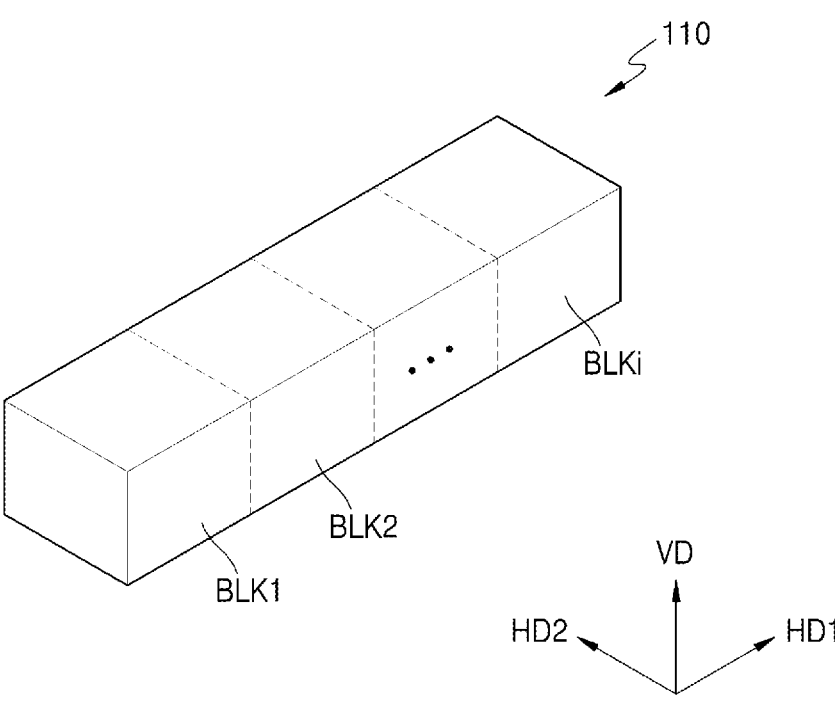
FIGS. 3A, 3B, and 3C are views for describing a three-dimensional (3D) V-NAND structure which may be implemented in a memory device of FIG. 1.
Figure 3B:
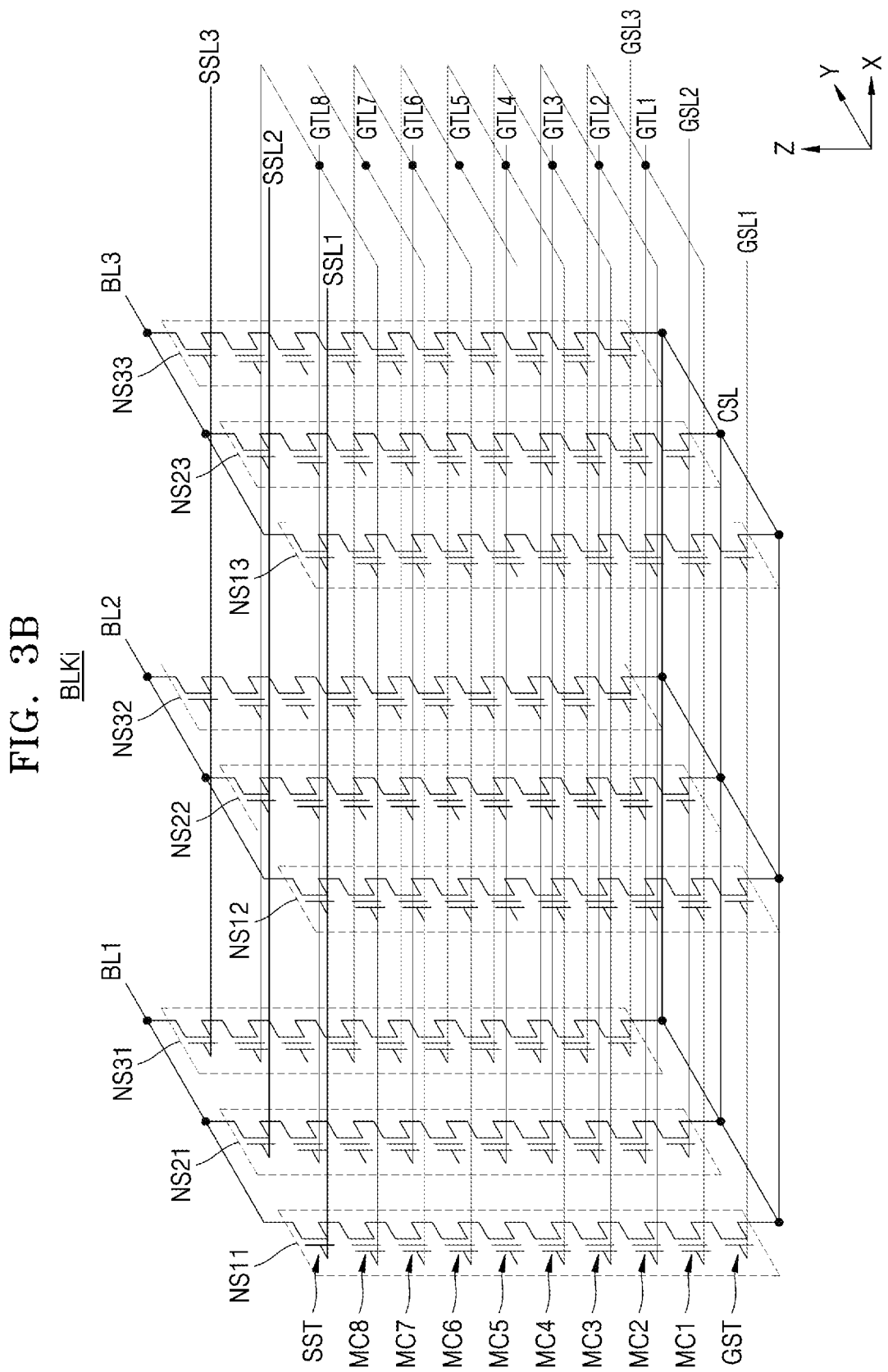
Figure 3C:
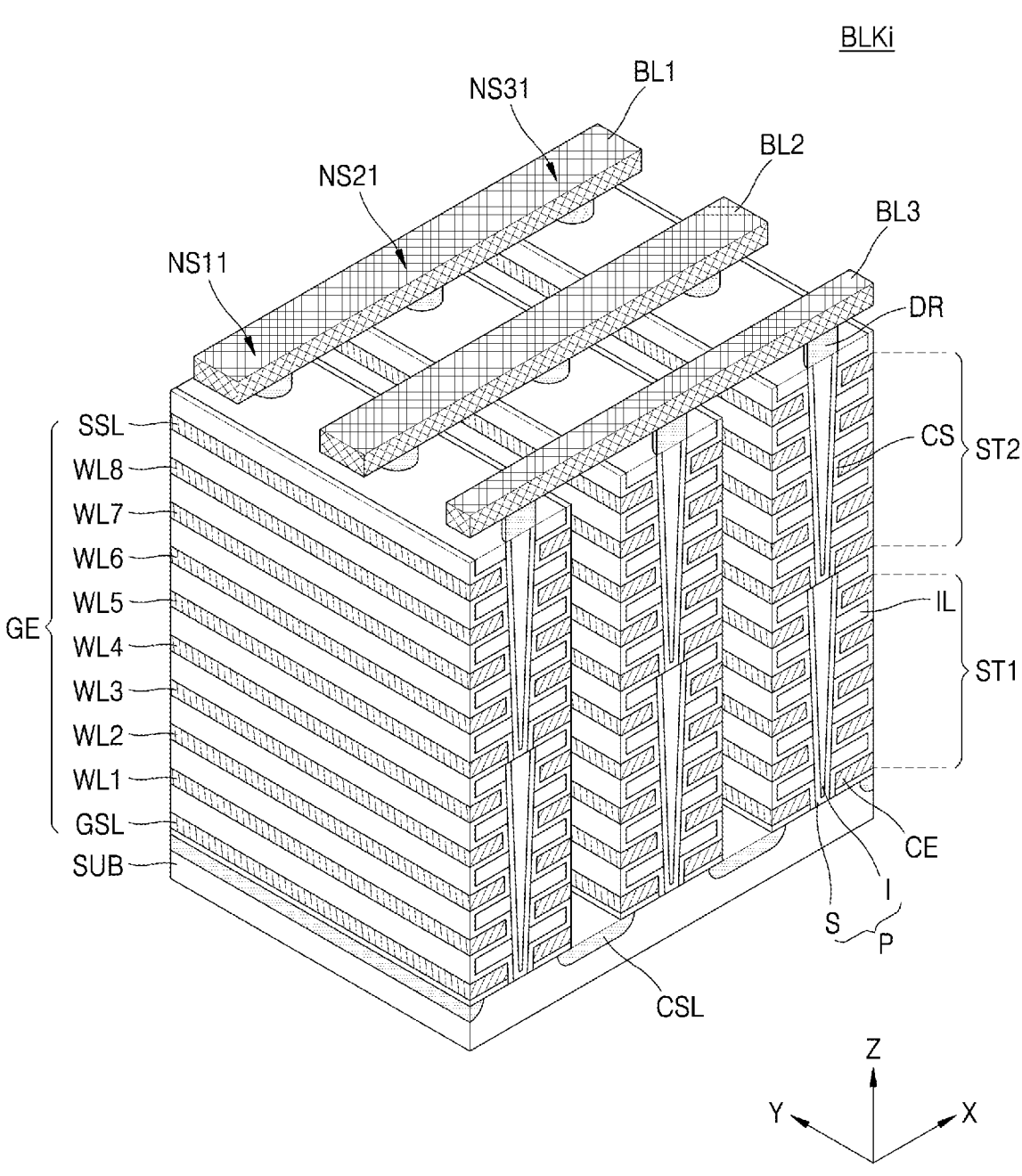
Figure 3D:
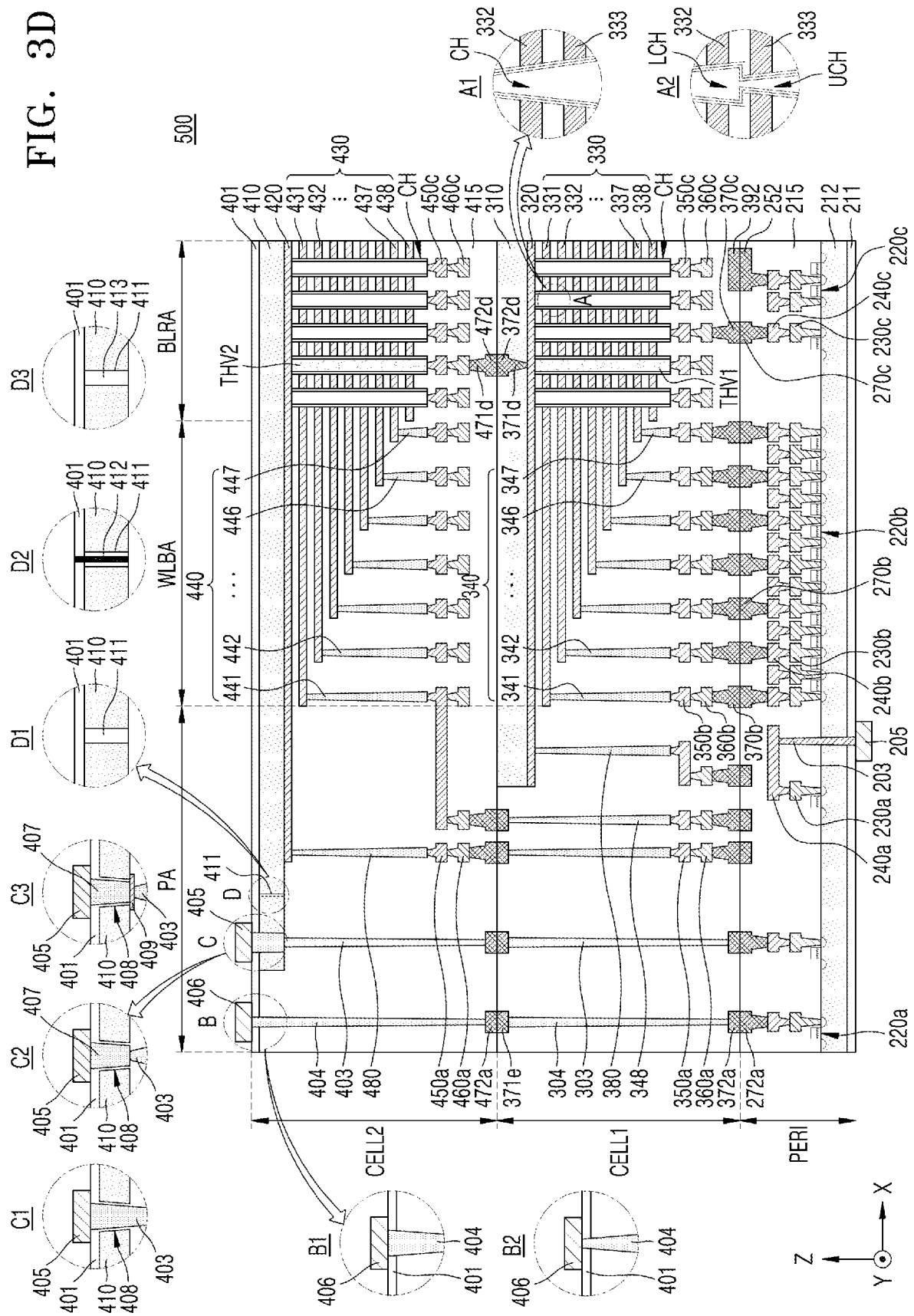
FIG. 3D is a view for describing a 3D BVNAND structure which may be implemented in a memory device.

FIGS. 3A to 3C are views for describing a three-dimensional (3D) V-NAND structure which may be implemented in the memory device 100 of FIG. 1. FIG. 3D is a view illustrating a memory device 500 according to some embodiments. FIGS. 3A to 3D may be described with reference to FIG. 1.

The memory cell array 110 (FIG. 1) of the memory device 100 (FIG. 1) may include a plurality of memory blocks.

Referring to FIG. 3A, the memory cell array 110 may include a plurality of memory blocks BLK1 to BLKi, where i may be a positive integer. Each of the plurality of memory blocks BLK1 to BLKi may have a 3D structure (or a vertical structure). In greater detail, each of the plurality of memory blocks BLK1 to BLKi may include a plurality of NAND strings extending in a vertical direction VD. Here, the plurality of NAND strings may be provided to be spaced apart from each other by a predetermined distance in a first horizontal direction HD1 and a second horizontal direction HD2. The plurality of memory blocks BLK1 to BLKi may be selected by a row decoder 740. For example, the address decoder 150 may select a memory block corresponding to a block address from among the plurality of memory blocks BLK 1 to BLKi.

Referring to FIG. 3B, the memory block BLKi may include a plurality of memory NAND strings NS11 to NS33 connected between bit lines BL1, BL2, and BL3 and a common source line CSL. Each of the plurality of memory NAND strings NS11 to NS33 may include a string select transistor SST, a plurality of memory cells MC1 to MC8, and a ground select transistor GST. For brevity and simplicity in the drawings, FIG. 3B illustrates that each of the plurality of memory NAND strings NS11 to NS33 includes eight memory cells MC1 to MC8. However, the inventive concepts are not necessarily limited thereto.

The string select transistor SST may be connected to a corresponding string select line SSL1, SSL2, or SSL3. The plurality of memory cells MC1 to MC8 may be respectively connected to gate lines GTL1 to GTL8 corresponding thereto. The gate lines GTL1 to GTL8 may correspond to word lines, and some of the gate lines GTL1 to GTL8 may correspond to dummy word lines. The ground select transistor GST may be connected to a corresponding ground select line GSL1, GSL2, or GSL3. The string select transistor SST may be connected to a corresponding bit line BL1, BL2, or BL3, and the ground select transistor GST may be connected to the common source line CSL.

The gate line (for example, GTL1) at the same height may be commonly connected, and each of the ground select transistors GSL1 to GSL3 and the string select lines SSL to SSL3 may be disconnected. FIG. 3B illustrates that the memory block BLKi may be connected to the eight gate lines GTL1 to GTL8 and the three bit lines BL1 to BL3. However, the inventive concepts are not necessarily limited thereto.

Further referring to FIG. 3C, the memory block BLKi may be formed in a direction perpendicular to a substrate SUB. Memory cells forming the memory NAND strings NS11 to NS33 may be stacked on a plurality of semiconductor layers.

The common source line CSL extending in a first direction (a Y direction) may be provided on the substrate SUB. Between two adjacent common source lines CSL on the substrate SUB, a plurality of insulating layers IL extending in the first direction (the Y direction) may be sequentially provided in a third direction (a Z direction), wherein the plurality of insulating layers IL may be spaced apart from each other in the third direction (the Z direction) by a predetermined distance. Between two adjacent common source lines CSL on the substrate SUB, a plurality of pillars P sequentially arranged in the first direction (the Y direction) and passing through the plurality of insulating layers IL in the third direction (the Z direction) may be provided. The plurality of pillars P may contact the substrate SUB by passing through the plurality of insulating layers IL. A surface layer S of each pillar P may include a silicon material doped with a first conductivity type and may function as a channel region.

An inner layer I of each pillar P may include an insulating material, such as silicon oxide, or an air gap. Between two adjacent common source lines CSL, a charge storage layer CS may be provided along exposed surfaces of the insulating layers IL, the pillars P, and the substrate SUB. The charge storage layer CS may include a gate insulating layer (or referred to as a "tunneling insulating layer"), a charge trap layer, and a blocking insulating layer. Also, between two adjacent common source lines CSL, a gate electrode GE, such as the ground select line GSL, the string select line SSL, and the word lines WL1 to WL8, may be provided on an exposed surface of the charge storage layer CS. Drains and drain contacts DR may be provided on each of the plurality of pillars P. The bit lines BL1 to BL3 extending in a second direction (an X direction) and arranged to be spaced apart from each other by a predetermined distance in the first direction (the Y direction) may be provided on the drain contacts DR.

As illustrated in FIG. 3C, each of the memory NAND strings NS11 to NS33 may be realized as a structure in which a first memory stack ST1 and a second memory stack ST2 are stacked. The first memory stack ST1 may be connected to the common source line CSL, the second memory stack ST2 may be connected to the bit lines BL1 to BL3, and the first memory stack ST1 and the second memory stack ST2 may be stacked to share a channel hole.

Referring to FIG. 3D, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 3D, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 3D. However, embodiments of the inventive concepts are not limited thereto. In some embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments of the inventive concepts are not limited thereto. In some embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be on and under the word lines 330, and the plurality of word lines 330 may be between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which may be formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it may be possible to reduce an influence of a non-uniform channel width between the lower and upper channels LCH and UCH on an operation of the memory device.

Meanwhile, the number of the lower word lines 331 and 332 penetrated by the lower channel LCH may be less than the number of the upper word lines 333 to 338 penetrated by the upper channel UCH in the region 'A2'. However, embodiments of the inventive concepts are not limited thereto. In some embodiments, the number of the lower word lines penetrated by the lower channel LCH may be equal to or more than the number of the upper word lines penetrated by the upper channel UCH. In addition, structural features and connection relation of the channel structure CH in the second cell region CELL2 may be substantially the same as those of the channel structure CH in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 3D, the first through-electrode THV1 may penetrate into or extend through the common source line 320 and the plurality of word lines 330. In some embodiments, the first through-electrode THV1 may further penetrate into the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*. The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

In FIG. 3D, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be in the external pad bonding region PA. Referring to FIG. 3D, a lower insulating layer 201 may cover a bottom surface of the first substrate 210, and a first input/output pad 205 may be formed on the lower insulating layer 201. The first input/output pad 205 may be connected to at least one of a plurality of the circuit elements 220*a* in the peripheral circuit region PERI through a first input/output contact plug 203 and may be separated from the first substrate 210 by the lower insulating layer 201. In addition, a side insulating layer may be between the first input/output contact plug 203 and the first substrate 210 and may electrically isolate the first input/output contact plug 203 from the first substrate 210.

An upper insulating layer 401 covering a top surface of the third substrate 410 may be formed on the third substrate 410. A second input/output pad 405 and/or a third input/output pad 406 may be on the upper insulating layer 401. The second input/output pad 405 may be connected to at least one of the plurality of circuit elements 220a in the peripheral circuit region PERI through second input/output contact plugs 403 and 303, and the third input/output pad 406 may be connected to at least one of the plurality of circuit elements 220a in the peripheral circuit region PERI through third input/output contact plugs 404 and 304.

In some embodiments, the third substrate 410 may not be in a region (e.g., may be absent from a region) in which the input/output contact plug is disposed. For example, as illustrated in a region 'B', the third input/output contact plug 404 may be separated from the third substrate 410 in a direction parallel to the top surface of the third substrate 410 and may penetrate or extend through an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in certain embodiments, the diameter of the second input/output contact plug 403 may become progressively less toward the second input/output pad 405.

In some embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less or smaller toward the lower metal pattern 371e or may become progressively greater or larger toward the lower metal pattern 371c.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments of the inventive concepts are not limited thereto, and in certain embodiments, the slit 411 may be formed to have a depth ranging from about 60% to about 70% of a thickness of the third substrate 410.

In some embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it may be possible to prevent a voltage provided through the second input/output pad 405 from affecting a metal layer on the third substrate 410 in the word line bonding region WLBA.

Meanwhile, in some embodiments, the first to third input/output pads 205, 405 and 406 may be selectively formed. For example, the memory device 500 may be realized to include only the first input/output pad 205 on the first substrate 210, to include only the second input/output pad 405 on the third substrate 410, or to include only the third input/output pad 406 on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

Figure 4:
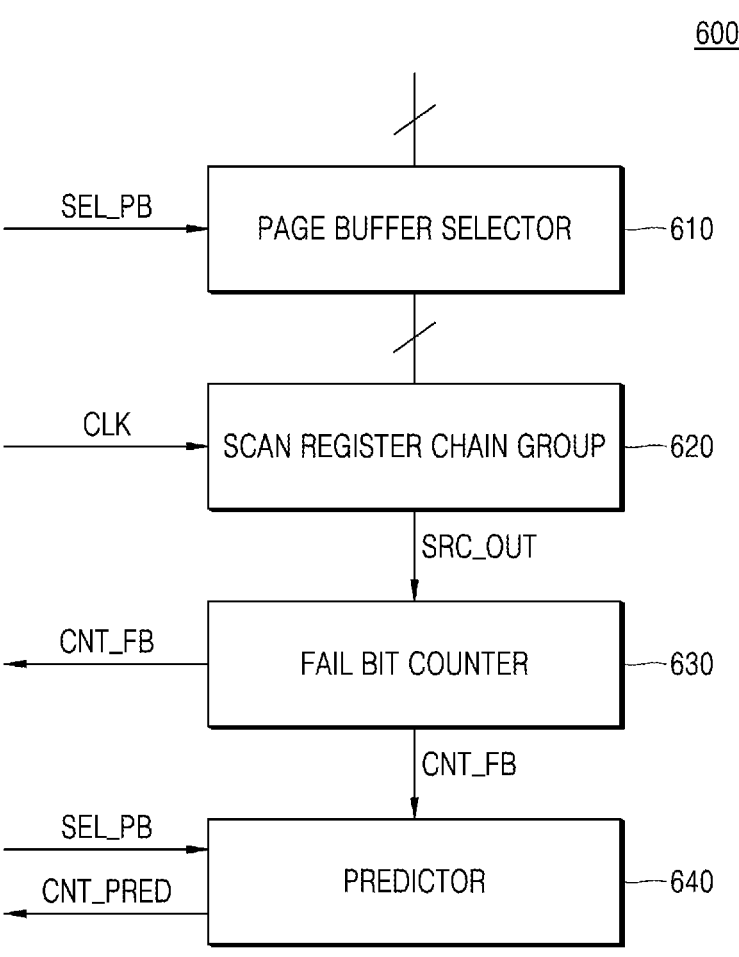
FIG. 4 is a block diagram of a prediction-based fail bit counter according to some embodiments.

FIG. 4 is a block diagram of the prediction-based fail bit counter 600 according to some embodiments. FIG. 4 may be described with reference to FIG. 2.

Referring to FIG. 4, the prediction-based fail bit counter 600 may include a page buffer selector 610, a scan register chain group 620, a fail bit counter 630, and a predictor 640.

The page buffer selector 610 may select one or more page buffers from the page buffer block 120. According to some embodiments, the page buffer selector 610 may receive a page buffer selection signal SEL_PB from the control logic 160 and, in response to the page buffer selection signal SEL_PB, may select one or more page buffers from the page buffer block 120. According to some embodiments, the page buffer selector 610 may receive a page buffer selection signal SEL_PB from the page buffer selection control circuit 650 and, in response to the page buffer selection signal SEL_PB, may select one or more page buffers from the page buffer block 120. The page buffer selector 610 may output data from each of the selected page buffers to the scan register chain group 620.

The scan register chain group 620 may include a plurality of scan register chains. The scan register chain may include one or more shift registers. The shift register may include one or more D flip-flops and one or more multiplexers MUX through which the one or more D flip-flops are passed with respect to a pass bit. The scan register chain group 620 may receive data from the page buffer selector 610. The scan register chain group 620 may receive a clock signal CLK from the control logic 160. The scan register chain group 620 may output a scan output signal SRC_OUT from the data by using the clock signal CLK, the one or more flip-flops, and the one or more multiplexers. The number of rising edges of the clock signal CLK during a section in which the scan output signal SRC_OUT has a logic high level and the number of fail bits may be the same as each other. The scan register chain group 620 may input the scan output signal SRC_OUT to the fail bit counter 630.

The fail bit counter 630 may receive the scan output signal SRC_OUT from the scan register chain group 620 and based on the scan output signal SRC_OUT, may output a value CNT_FB of the number of fail bits with respect to selected one or more page buffers. Referring to FIG. 4, the fail bit counter 630 may be included in the prediction-based fail bit counter 600. However, the fail bit counter 630 is not limited to the embodiments described above. According to some embodiments, the fail bit counter 630 may be included in the control logic 160.

The predictor 640 may receive the page buffer selection signal SEL_PB and the value CNT_FB of the number of fail bits with respect to the selected one or more page buffers and may output, based on a ratio of a number of page buffers on which a fail bit counting operation is performed to the total number of page buffers of the page buffer block 120 and the number of fail bits with respect to the page buffers on which the fail bit counting operation is performed, a prediction value CNT_PRED with respect to the total number of fail bits with respect to the page buffer block 120. According to some embodiments, the predictor 640 may receive a page buffer selection signal SEL_PB from the control logic 160. According to some embodiments, the predictor 640 may receive the page buffer selection signal SEL_PB from the page buffer selection control circuit 650. Referring to FIG. 4, the predictor 640 may receive, from the fail bit counter 630, the value CNT_FB of the number of fail bits with respect to the selected one or more page buffers. In some embodiments, and differing from the example of FIG. 4, the predictor 640 may receive, from the control logic 160, the value CNT_FB of the number of fail bits with respect to the selected one or more page buffers.

According to some embodiments, during a first clock signal section, the predictor 640 may output the prediction value CNT_PRED, when the fail bit counting operation is not performed on all of the page buffers of the page buffer block 120 based on the repetition of the fail bit counting operation on the selected one or more page buffers. That is, during the first clock signal section, the predictor 640 may output the prediction value CNT_PRED, when the fail bit counting operation is performed on only some of the page buffers of the page buffer block 120. The first clock signal section may refer to the predetermined number of clock signals. For example, the first clock signal section may indicate 256 clock signals. During the first clock signal section, the predictor 640 may not output the prediction value CNT_PRED, when the fail bit counting operation is performed on all of the page buffers of the page buffer block 120 based on the repetition of the fail bit counting operation on the selected one or more page buffers.

Also, during the first clock signal section, the predictor 640 may not output the prediction value CNT_PRED, when the fail bit counting operation is performed on all of the page buffers of the page buffer block 120 based on the repetition of the fail bit counting operation on the selected one or more page buffers.

Figure 5:
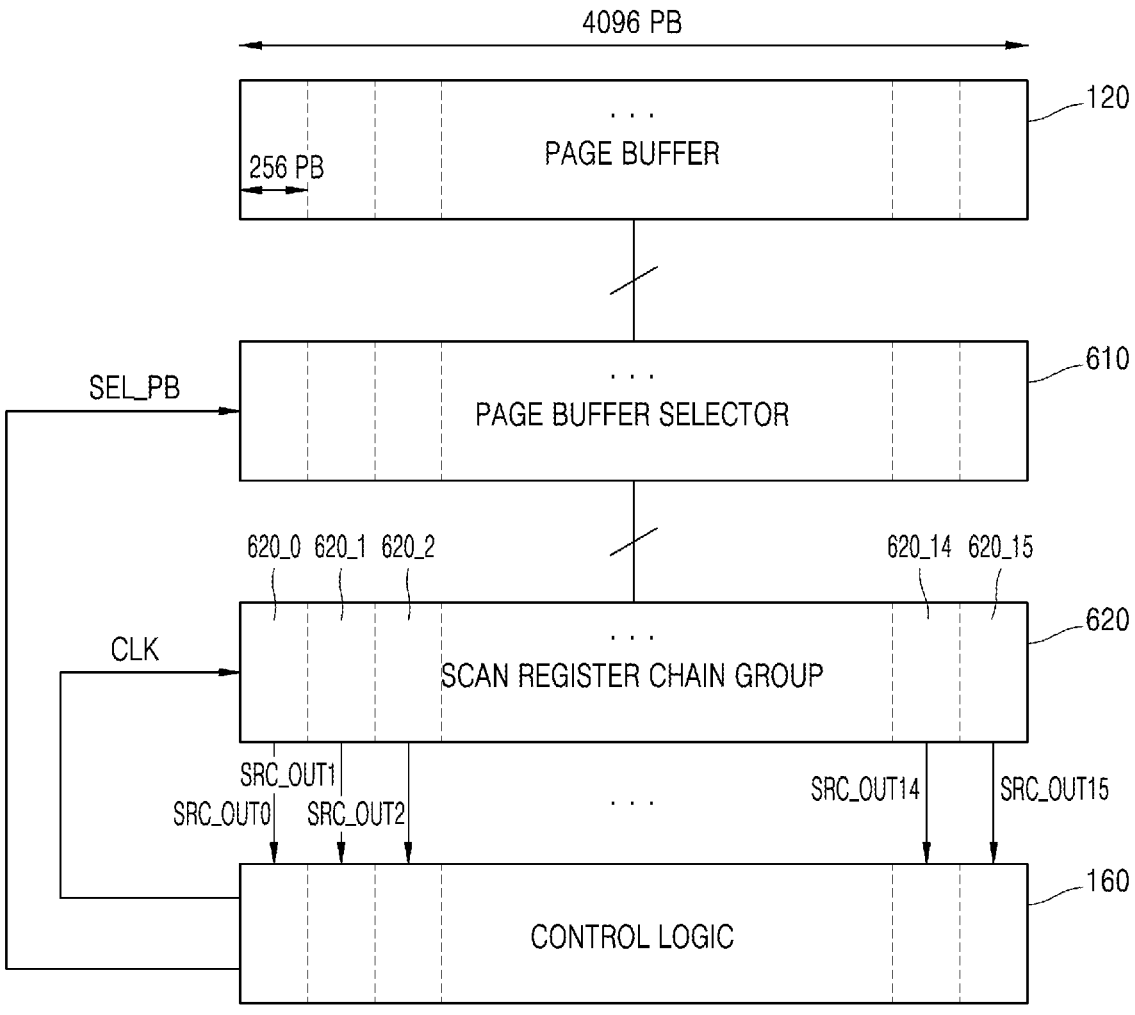
FIG. 5 is a block diagram of a device including a scan register chain group according to some embodiments.
Figure 6:
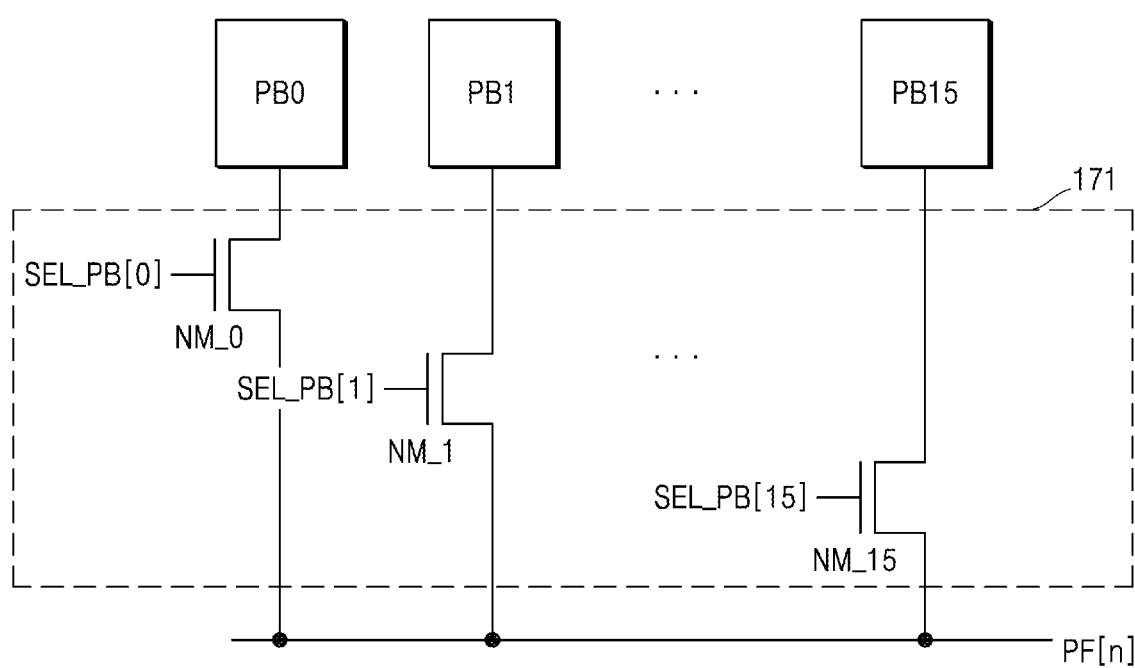
FIG. 6 illustrates a page buffer selector according to some embodiments.
Figure 7:
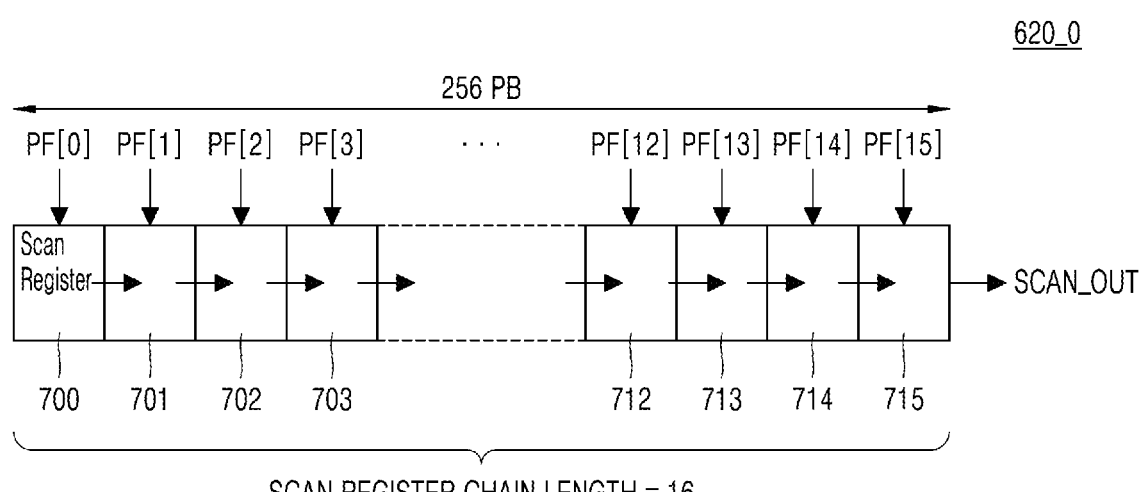
FIG. 7 illustrates a scan register chain according to some embodiments.

FIG. 5 is a block diagram of a device including a scan register chain group 620 according to some embodiments. FIG. 6 illustrates a page buffer selector 610 according to some embodiments. FIG. 7 illustrates a scan register chain

Figure 8:
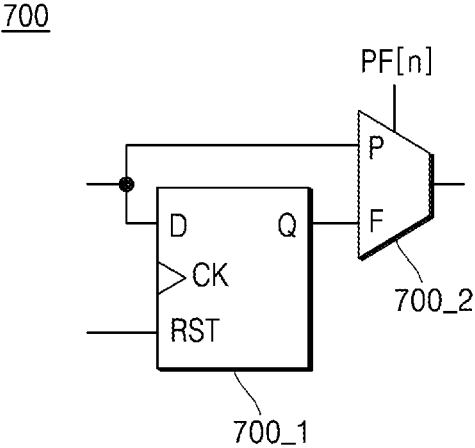
FIG. 8 illustrates a scan register according to some embodiments.

620_0 according to some embodiments. FIG. 8 illustrates a scan register 700 according to some embodiments. FIGS. 5 to 7 may be described with reference to FIGS. 1 and 2.

Referring to FIG. 5, the page buffer block 120 may include 4096 page buffers. The page buffer block 120 may include 16 page buffer groups. Each page buffer group may include 256 page buffers. Each page buffer group may include 16 page buffer sub-groups. Accordingly, each page buffer sub-group may include 16 page buffers. Referring to FIG. 6, for example, a page buffer sub-group may include 16 page buffers PB0 to PB15. The number of page buffers may vary and is not limited to the embodiments described above. Also, grouping of the page buffers may vary and is not limited to the embodiments described above.

The page buffer selector 610 may select one page buffer for each page buffer sub-group. Referring to FIG. 6, the page buffer selector 610 may include 16 NMOS transistors NM_0 to NM_15. The page buffer selector 610 may receive a page buffer selection signal SEL_PB. For example, the page buffer selector 610 may receive the page buffer selection signal SEL_PB from the control logic 160. For example, the page buffer selector 610 may receive the page buffer selection signal SEL_PB from the page buffer selection control circuit 650.

Referring to FIG. 6, when the page buffer selector 610 receives a page buffer selection signal SEL_PB[0], the page buffer selector 610 may select the page buffer PB0 and may output data PF[n] of the page buffer PB0. When the page buffer selector 610 receives a page buffer selection signal SEL_PB[1], the page buffer selector 610 may select the page buffer PB1 and may output data PF[n] of the page buffer PB1. With an increment of the page buffer selection signal SEL_PB, the fail bit counting operation may be repeated. For example, with an increment of a page buffer selection signal SEL_PB[15:0], the fail bit counting operation may be repeated 16 times. Accordingly, the page buffer selection signal SEL_PB may include information about a progression rate of the fail bit counting operation.

Referring to FIG. 5 again, the scan register chain group 620 may include first to sixteenth scan register chains 620_0 to 620_15. The page buffer selector 610 may load data to the scan register chain group 620. The scan register chain group 620 may receive a clock signal CLK from the control logic 160. The scan register chain group 620 may output scan output signals SRC_OUT0 to SRC_OUT15 by using the clock signal CLK and a shift register. The control logic 160 may receive the scan output signals SRC_OUT0 to SRC_OUT15 and may transmit the page buffer selection signal SEL_PB to the page buffer selector 610 in order to select another page buffer.

Referring to FIG. 7, the scan register chain 620_0 may include 16 scan registers 700 to 715. The scan register chain 620_0 may include various numbers of scan registers and is not limited to the embodiments described above. The scan register chain 620_0 may receive data PF[0] to PF[15] from the page buffer selector 610. The scan register chain 620_0 may receive the clock signal CLK and the data PF[0] to PF[15] and may output the scan output signal SRC_OUT.

Referring to FIG. 8, the scan register 700 may include a D flip-flop 700_1 and a multiplexer MUX 700_2. The scan register 700 may receive data from the page buffer selector 610. When the data is a pass bit, the data may pass the D flip-flop 700_1 through the MUX 700_2. When the data is a fail bit, the scan register 700 may receive the clock signal CLK from the control logic 160. When the D flip-flop 700_1 is reset, the D flip-flop 700_1 may output 0. The MUX 700_2 may select p when the data PF[n] received from the page buffer selector 610 indicates "pass" and may select F when the data PF[n] received from the page buffer selector 610 indicates "fail." The data PF[n] loaded to the scan register 700 may indicate "pass" or "fail." For example, when the data PF[n] loaded to the scan register 700 is 0, it may indicate "pass," and when the data PF[n] loaded to the scan register 700 is 1, it may indicate "fail."

Figure 9A:
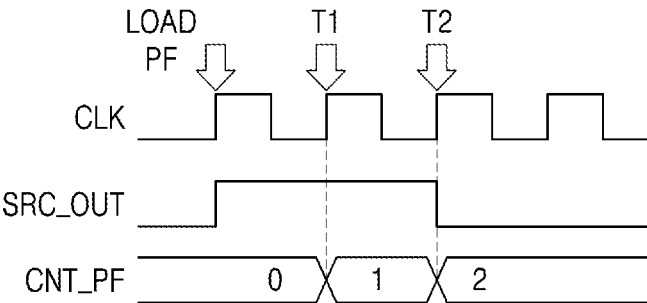
FIG. 9A is a timing diagram with respect to an operation of a scan register chain according to some embodiments.
Figure 9B:
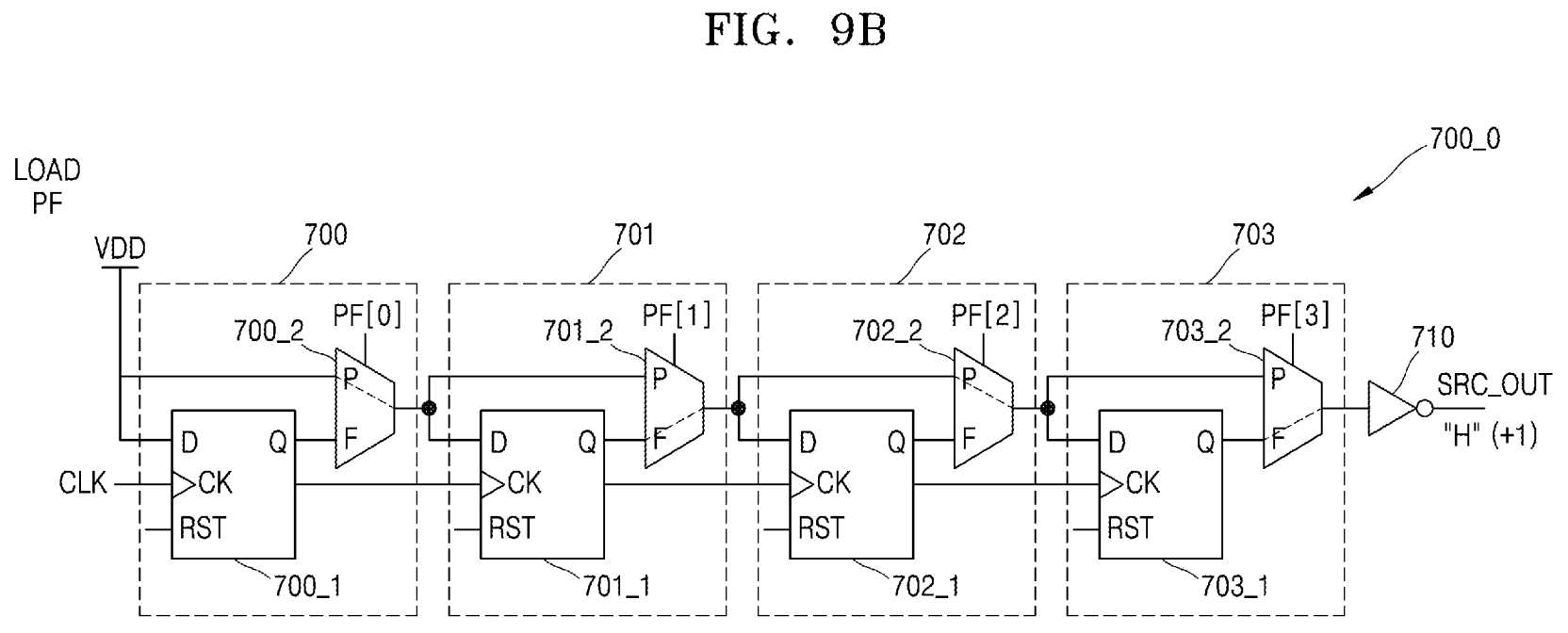
Figure 9C:
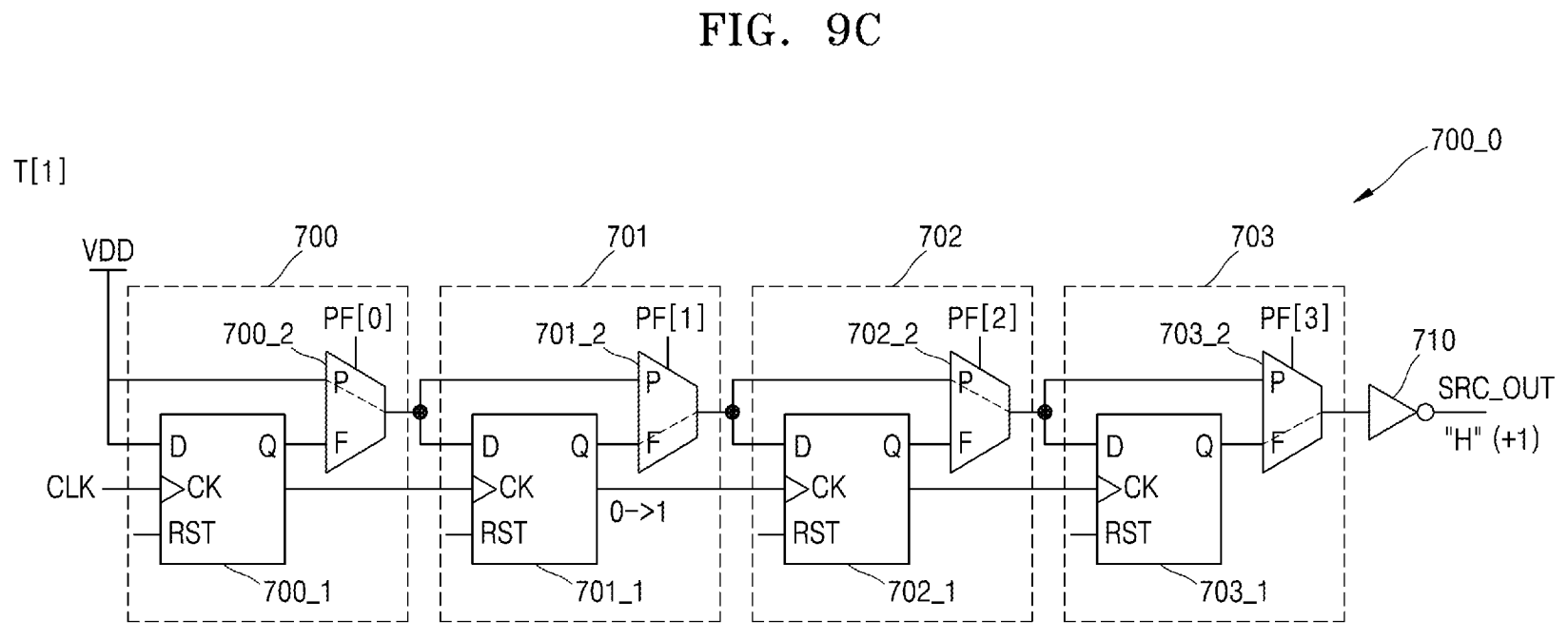

FIG. 9A is a timing diagram with respect to an operation of a scan register chain 700_0 according to some embodiments. FIG. 9B illustrates an operation of the scan register chain 700_0 at a time point at which data PF is input in FIG. 9A. FIG. 9C illustrates an operation of the scan register chain 700_0 at a time point T1 in FIG. 9A. FIG. 9C illustrates an operation of the scan register chain 700_0 at a time point T2 in FIG. 9A.

Figure 9D:
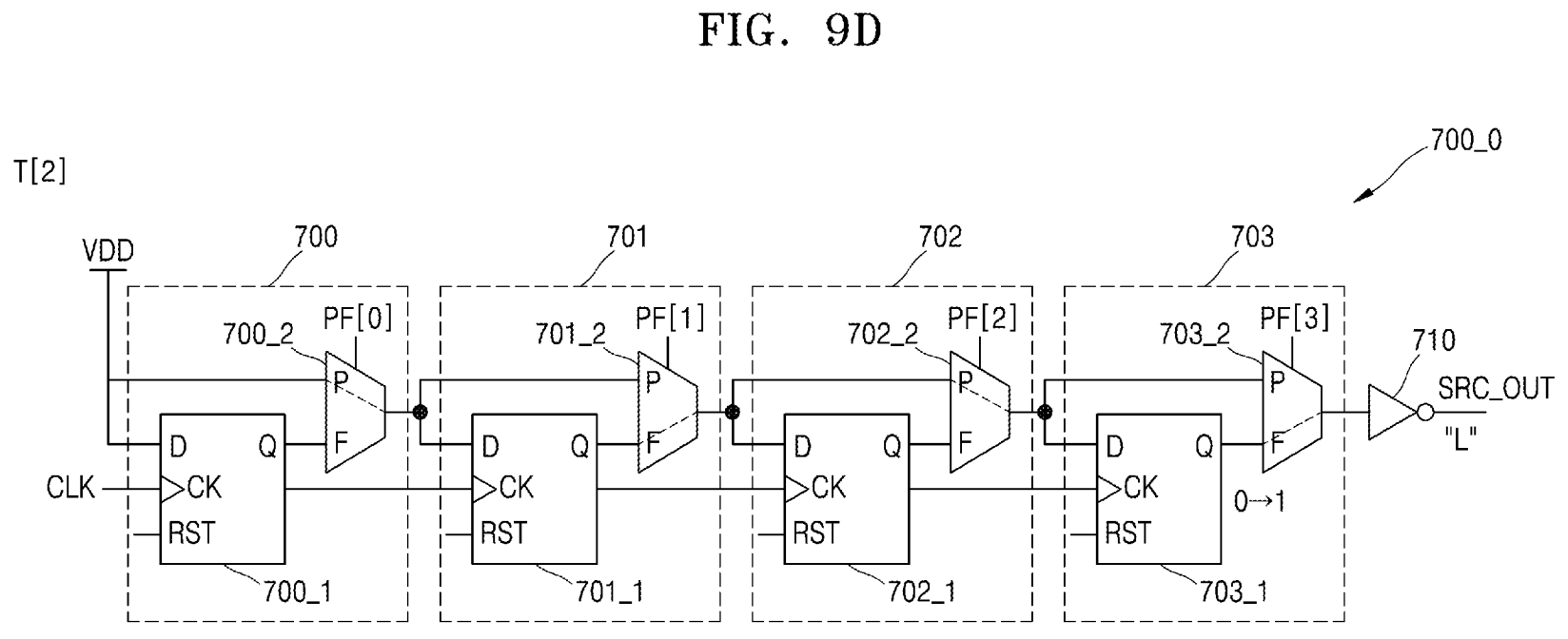

FIG. 9A as well as FIGS. 9B to 9D is a timing diagram of a case in which data PF[0], data PF[1], data PF[2], and data PF[3] are input to the scan register chain 700_0 including four D flip-flops 700_1, 701_1, 702_1, and 703_1 and four multiplexers 700_2, 701_2, 702_2, and 703_2. Before the data is input to the scan register chain 700_0, the scan register chain 700_0 may be reset. Accordingly, all of the D flip-flops 700_1 to 703_1 may output 0. That is, the D flip-flops 700_1 to 703_1 may output a low level voltage. The data PF[0] and the data PF[2] may be 0 ("pass"), and the data PF[1] and the data PF[3] may be 1 ("fail"). That is, there are two fail bits. Referring to FIG. 9A, a scan output signal SRC_OUT may rise when the data is loaded. Also, after two clock signals, the number of which corresponds to the number of fail bits, the scan output signal SRC_OUT may fall. That is, the number of clock signals during a section in which the scan output signal SRC_OUT has a logic high level may be the same as the number of fail bits. Accordingly, when the number of fail bits is increased, an increased number of clock signals may be required.

FIG. 9B illustrates the scan register chain 700_0 at a time point at which data PF is input. Referring to FIG. 9B, a high level voltage VDD may be input to the scan register 700 of an input terminal of the scan register chain 700_0. The MUX 700_2 may transmit the high level voltage VDD to a scan register 701 because the data PF[0] indicates "pass." Accordingly, the D flip-flop 701_1 may receive the high level voltage VDD. Because the data PF[1] indicates "fail," the MUX 701_2 may transmit a low level voltage, which is an output of the D flip-flop 701_1, to a scan register 702. Because the data PF[2] indicates "pass," the MUX 702_2 may transmit a low level voltage, which is an output of the scan register 701, to a scan register 703. Because the data PF[3] indicates "fail," the MUX 703_2 may output a low level voltage, which may be an output of the D flip-flop 703_1. The output of the MUX 703_2 may be input to an inverter 710. Thus, the inverter 710 may output the scan output signal SRC_OUT having a high level voltage.

FIG. 9C illustrates an operation of the scan register chain 700_0 at the time point T1 in FIG. 9A. Referring to FIG. 9C, a clock signal CLK may be input to each of the D flip-flops 700_1 to 703_1. Accordingly, the D flip-flop 701_1 may output a high level voltage. The MUX 701_2 may transmit the high level voltage output by the D flip-flop 701_1 to the scan register 702. The MUX 702_2 may transmit the high level voltage received from the MUX 701_2 to the scan register 703. The MUX 703_2 may output a low level voltage, which may be an output of the D flip-flop 703_1. The inverter 710 may output a scan output signal SRC_OUT having a high level voltage.

FIG. 9D illustrates an operation of the scan register chain 700_0 at the time point T2 in FIG. 9A. Referring to FIG. 9D, a clock signal CLK may be input to each of the D flip-flops 700_1 to 703_1. Accordingly, the D flip-flops 702_1 and 703_1 may output a high level voltage. The MUX 703_2 may output the high level voltage, which is the output of the D flip-flop 703_1. Accordingly, the inverter 710 may output a low level voltage.

As described above, the scan register chain 700_0 may maintain a logic level of the scan output signal SRC_OUT during a section of the clock signals CLK, the number of which is the same as the two fail bits PF[1] and PF[3].

Figure 10:
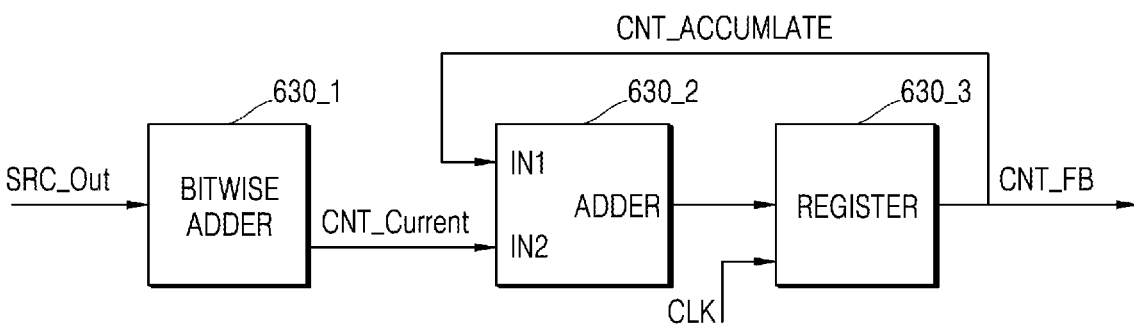
FIG. 10 is a block diagram of a fail bit counter according to some embodiments.

FIG. 10 is a block diagram of the fail bit counter 630 according to some embodiments. FIG. 10 may be described with reference to FIG. 4.

Referring to FIG. 10, the fail bit counter 630 may include a bitwise adder 630_1, an adder 630_2, and a register 630_3. The bitwise adder 630_1 may receive a scan output signal SRC_OUT. The bitwise adder 630_1 may output a current signal CNT_Current including information about the number of 1 bits from the scan output signal SRC_OUT. The current signal CNT_Current may be a binary signal. In a first cycle, when the scan output signal SRC_OUT includes three 1 bits, the bitwise adder 630_1 may output 3 in a binary form. The adder 630_2 may receive 3 and transmit 3 to the register 630_3. The register 630_3 may output 3, which is a value CNT_FB of the number of fail bits. In a second cycle, when the scan output signal SRC_OUT includes two 1 bits, the bitwise adder 630_1 may output 2 in a binary form. The adder 630_2 may receive 2 from IN2. The adder 630_2 may receive 3 from IN1. The adder 630_2 may output 5 by adding 2 and 3 together. The register 630_3 may output 5, which is a value CNT_FB of the number of fail bits. As described above, the fail bit counter 630 may output the value CNT_FB of the number of fail bits based on repetition of a fail bit counting operation.

In a third cycle, when the scan output signal SRC_OUT includes zero 1 bit, the bitwise adder 630_1 may output 0 in a binary form. When the bitwise adder 630_1 outputs 0, the fail bit counter 630 may determine that the fail bit counting operation is completed. The adder 630_2 may output 5 by adding 0 and 5 together. The register 630_3 may store 5, which is a value CNT_FB of the number of fail bits.

Figure 11:
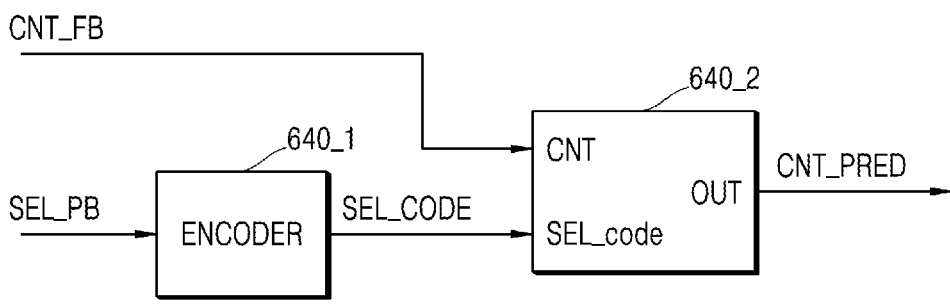
FIG. 11 is a block diagram of a predictor according to some embodiments.

FIG. 11 is a block diagram of the predictor 640 according to some embodiments. FIG. 11 may be described with reference to FIGS. 4 to 6.

Referring to FIG. 11, the predictor 640 may include an encoder 640_1 and a calculator 640_2. The encoder 640_1 may receive a page buffer selection signal SEL_PB. The encoder 640_1 may encode the page buffer selection signal SEL_PB into a page buffer selection code SEL_CODE. The calculator 640_2 may receive a value CNT_FB of the number of fail bits and the page buffer selection code SEL_CODE.

Referring to FIG. 6, the page buffer selection signal SEL_PB may have 16 values of SEL_PB[0] to SEL_PB[15]. For example, the page buffer selection signal SEL_PB may have 16 values as one hot decode signal. The calculator 640_2 may output a prediction value CNT_PRED of the total number of fail bits by using the value CNT_FB of the number of fail bits and the page buffer selection code SEL_CODE. For example, the calculator 640_2 may perform the calculation as Equation 1 below.

$$\text{The prediction value} \quad \text{[Equation 1]}$$
$$\text{CNT\_PRED of the total number of fail bits} =$$
$$\text{the value CNT\_FB of the number of fail bits} * \text{a maximum}$$
$$\text{value of the page buffer selection signal SEL\_PB}/a$$
$$\text{value of the page buffer selection signal SEL\_PB.}$$

In Equation 1, the maximum value of the page buffer selection signal SEL_PB may indicate the maximum number of page buffers which may be selected by the page buffer selector 610. Referring to FIG. 6, the maximum value of the page buffer selection signal SEL_PB may be 16.

Figure 12:
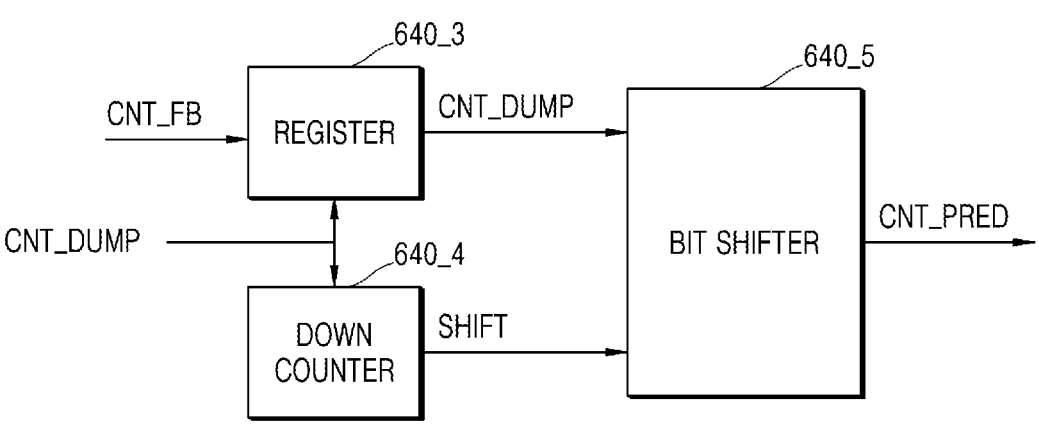
FIG. 12 is a block diagram of a predictor according to some embodiments.

FIG. 12 is a block diagram of the predictor 640 according to some embodiments.

According to some embodiments, the predictor 640 may generate a prediction value CNT_PRED of the total number of fail bits with respect to a plurality of page buffers based on a ratio of a number of page buffers on which a fail bit counting operation is performed to the total number of the plurality of page buffers and the number of fail bits with respect to the page buffers on which the fail bit counting operation is performed based on a bit shift.

Referring to FIG. 12, the predictor 640 may include a register 640_3, a down counter 640_4, and a bit shifter 640_5. The register 640_3 may receive a value CNT_FB of the number of fail bits and a page buffer selection signal SEL_PB. The register 640_3 may encode the page buffer selection signal SEL_PB into a page buffer selection code SEL_CODE. The register 640_3 may generate a dump clock signal DUMP_CLK (not shown) at a time point corresponding to $\frac{1}{2}^n$ (n is an integer equal to or greater than 1) of a value of the page buffer selection code SEL_CODE. For example, when a maximum value of the page buffer selection code SEL_CODE is 16, the register 640_3 may generate the dump clock signal DUMP_CLK at time points corresponding to $\frac{1}{16}$, $\frac{1}{8}$, $\frac{1}{4}$, and $\frac{1}{2}$ of 16.

The register 640_3 may convert the value CNT_FB of the number of fail bits into a dump count CNT_DUMP based on a rising edge of the dump clock signal DUMP_CLK. The register 640_3 may store information about the number of fail bits by using the dump clock signal DUMP_CLK.

The register 640_3 may transmit the dump count CNT_DUMP to the down counter 640_4. The down counter 640_4 may output a shift value SHIFT based on the dump clock signal DUMP_CLK.

The bit shifter 640_5 may receive the dump count CNT_DUMP and a first shift value. The bit shifter 640_5 may output the prediction value CNT_PRED of the total number of fail bits with respect to the plurality of page buffers, based on the dump count CNT_DUMP and the first shift value. For example, the bit shifter 640_5 may output the prediction value CNT_PRED of the total number of fail bits by left-shifting a value of the dump count CNT_DUMP by the shift value SHIFT. That is, the bit shifter 640_5 may output the prediction value CNT_PRED of the total number of fail bits by performing a calculation of $\text{CNT\_DUMP} * 2^{\text{SHIFT}}$.

Figure 13:
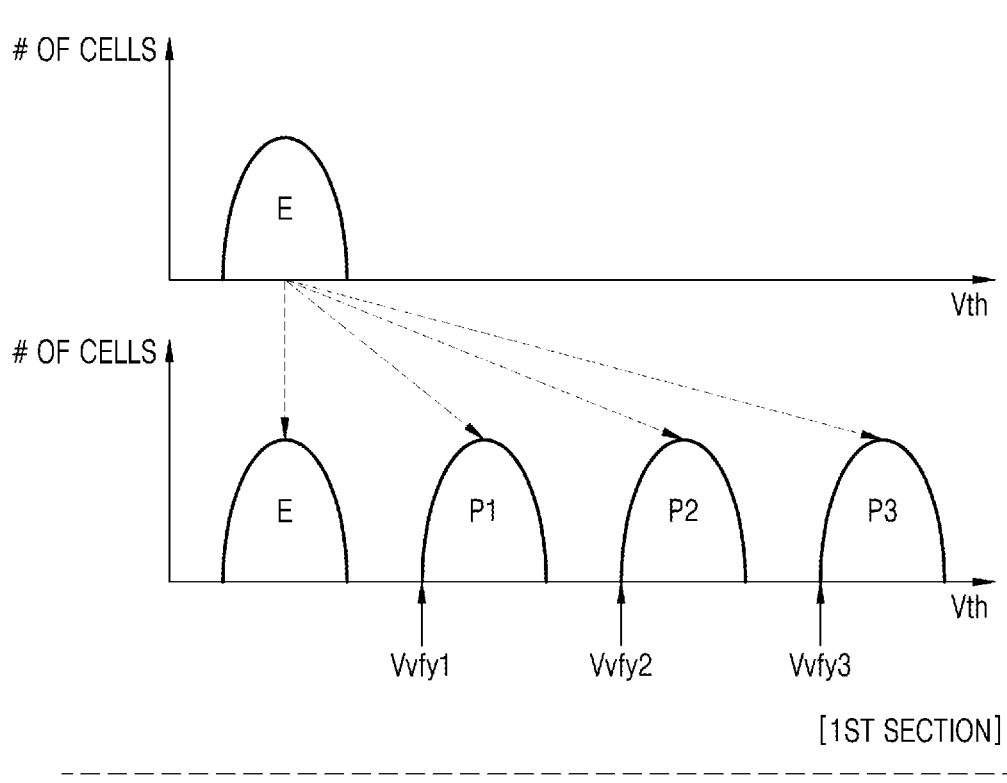
FIG. 13 is a view for describing a program operation on memory cells according to some embodiments.
Figure 13:
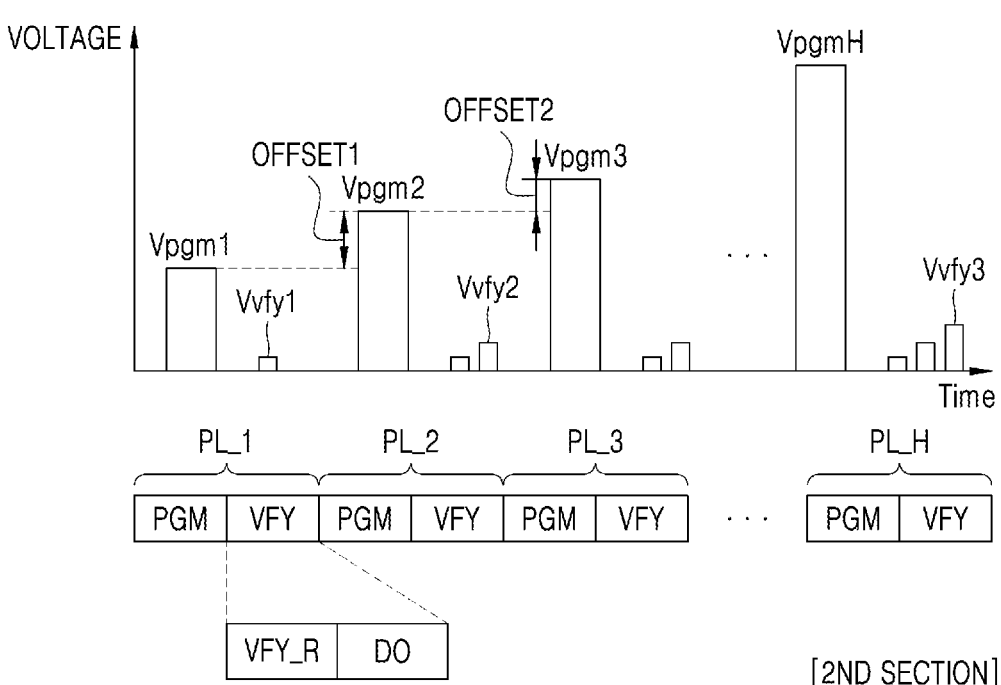
Figure 14:
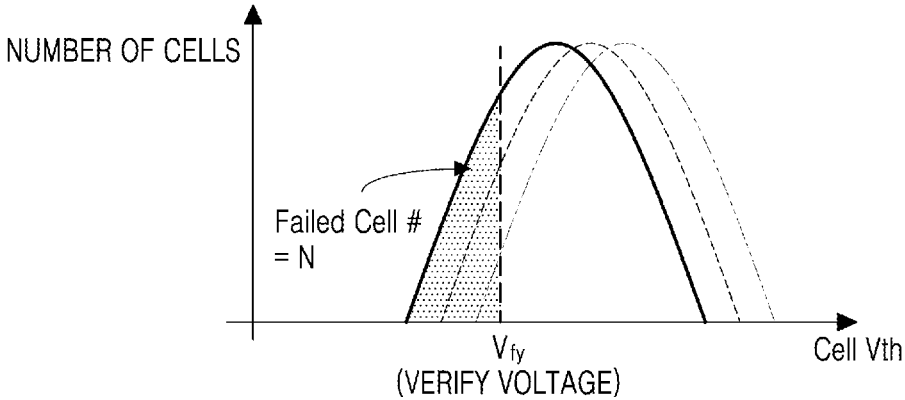
FIG. 14 is a view with respect to improvement in program management of a memory device according to some embodiments.

FIG. 13 is a view for describing a program operation on memory cells according to some embodiments. FIG. 14 is a view with respect to improvement in program management of a memory device according to some embodiments. FIG. 13 may be described with reference to FIGS. 1 and 2.

FIG. 13 is described assuming that the memory cell is a multi-level cell, for convenience of explanation. The descriptions given hereinafter may also be applied to a single level cell, a triple level cell, a quadruple level cell, etc.

Referring to FIG. 13, as illustrated in a first section, the memory cells of the memory cell array 100 may have any one state of an erase state E and first to third program states P1 to P3. For example, the memory cells may be in the erase state E as an initial state and as a result of the program operation on the memory cells, may have any one state of the erase state E and the first to third program states P1 to P3.

As illustrated in a second section, the memory device 100 may program the memory cells based on an ISPP method. The memory device 100 may program the memory cells by performing a plurality of program loops PL_1 to PL_H. The program loops PL_1 to PL_H may include program operations PGM respectively applying program voltages Vpgm1 to VpgmH to select word lines and verify operations VFY configured to verify program states of the memory cells. Whenever each of the program loops PL_1 to PL_H is sequentially performed, the program voltage applied to the select word line in the program operation PGM may be increased by an offset voltage OFFSET. For example, a difference between the program voltage Vpgm1 of the first program loop PL_1 and the program voltage Vpgm2 of the second program loop PL_2 may be a first offset voltage OFFSET1, and a difference between the program voltage Vpgm2 of the second program loop PL_2 and the program voltage Vpgm3 of the third program loop PL_3 may be a second offset voltage OFFSET2. The first offset voltage OFFSET1 and the second offset voltage OFFSET2 may be controlled by the memory device 100 in the same manner or different manners.

The verify operation VFY may include a verify read operation VFY_R and a determination operation DO. The verify read operation VFY_R refers to an operation of reading the memory cells based on first to third verify voltages Vvfy1 to Vvfy3. For example, memory cells, target program states of which are a first program state P1, may be read by the first verify voltage Vvfy1. A memory cell, a target program state of which is the first program state P1, and which is programmed into the first program state P1, may be read by the first verify voltage Vvfy1 as an off cell, and a memory cell, a target program state of which is the first program state P1, and which is not yet programmed into the first program state P1, may be read by the first verify voltage Vvfy1 as an on cell. The verify read operation VFY_R may be performed on memory cells, target program states of which are a second program state P2 or a third program state P3, by using the second verify voltage Vvfy2 or the third verify voltage Vvfy3, as described above.

After the verify read operation VFY_R is performed, the determination operation DO may be performed, and the determination operation DO may include an operation of determining "pass/fail" of the program operation PGM of the program loop. Furthermore, the determination operation DO may include an operation of determining an inclination of a threshold voltage distribution formed by the memory cells based on the program operation PGM, the characteristics of a fast cell and a slow cell of the memory cells, etc. The determination operation DO may be performed by using the number of off cells generated by the verify read operation VFY_R. The memory device 100 according to some embodiments may determine "pass/fail" with respect to the program operation PGM, by using the prediction value CNT_PRED of the prediction-based fail bit counter 600.

Also, the memory device 100 according to some embodiments may perform dynamic ISPP based on the prediction value CNT_PRED during a program verify operation.

Referring to FIG. 14, three graphs indicate a first loop, a second loop, and a third loop of a fail bit counting operation, respectively. The loop may denote a program operation in the ISPP operation. The graph on the left may indicate the first loop, the graph in the middle may indicate the second loop, and the graph on the right may indicate the third loop. In the first loop, even when there are a great number of fail bits, the memory device 100 according to some embodiments may output the prediction value CNT_PRED of the fail bits and may perform ISPP based on the prediction value CNT_PRED. That is, the memory device 100 according to some embodiments may determine an ISPP intensity based on the prediction value CNT_PRED. Accordingly, the memory device 100 according to some embodiments may perform a program operation of the second loop based on a result of the first loop, and the fail bits may be reduced.

The memory device 100 according to some embodiments may apply at least one of a program voltage, an erase voltage, and a read voltage to the memory cell array 110 based on at least one of a value of the number of fail bits and the prediction value CNT_PRED.

Figure 15:
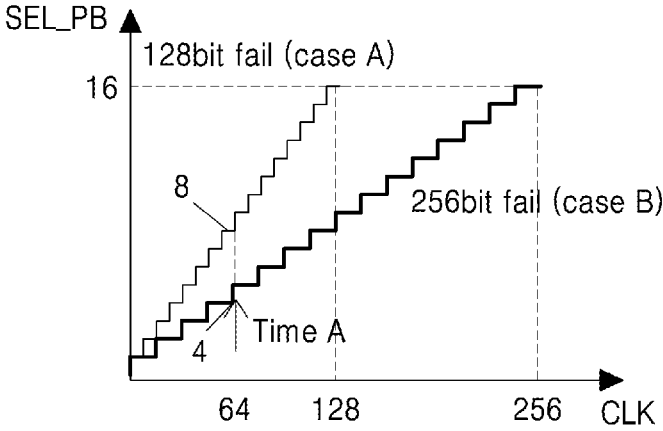
FIG. 15 illustrates a fail bit count progression rate with respect to a page buffer block according to a clock signal according to some embodiment.

FIG. 15 illustrates a progression rate of a fail bit counting operation on a page buffer block according to a clock signal according to some embodiments.

FIG. 15 may be described with reference to FIGS. 1 and 2. In FIG. 15, it is assumed that the page buffers are divided into 16 areas. Accordingly, it is assumed that a value of the page buffer selection signal SEL_PB increases from 1 to 16. The page buffer selection signal SEL_PB may include information about a progression rate of a fail bit counting operation. Also, it is assumed that the memory device 100 performs the fail bit counting operation on 256 page buffers. Referring to FIG. 14, a graph shows each of a case when there are 128 fail bits (Case A) (that is, when there are fail bits of 50%) and a case when there are 256 fail bits (Case B) (that is, when there are fail bits of 100%).

Referring to FIG. 15, when there are 128 fail bits (Case A), 128 clock signals may be used in a fail bit counting operation. When there are 256 fail bits (Case B), 256 clock signals may be used in the fail bit counting operation. At a time point TIME A at which 64 clock signals have passed, the memory device 100 may predict the total number of fail bits by considering information about a progression rate of the page buffer selection signal SEL_PB. When there are 128 fail bits, at the time point TIME A at which 64 clock signals have passed, a value of the page buffer selection signal SEL_PB may be 8. The value of the page buffer selection signal SEL_PB may increase to 16, and thus, the prediction value of the total number of fail bits may be 64*16/8=128.

This may be represented by Equation 2 below.

$$\text{The prediction value of the total number of fail bits} = \quad \text{[Equation 2]}$$
$$(\text{the number of fail bits at a predetermined time point}) *$$
$$(16/\text{a value of the page buffer selection signal})$$

When there are 256 fail bits, at the time point TIME A at which 64 clock signals have passed, a value of the page buffer selection signal SEL_PB may be 4. The value of the page buffer selection signal SEL_PB may increase to 16, and thus, the prediction value of the total number of fail bits may be 64*16/4=256. Accordingly, at the time point TIME A at which 64 clock signals have passed, the counted number of fail bits is 64 in both Case A and Case B, but the memory device 100 according to some embodiments may predict the total number of fail bits by considering the progression rate of the fail bit counting operation. That is, the memory device 100 according to some embodiments may predict the total number of fail bits by considering the information about the progression rate of the fail bit counting operation at a predetermined time point.

Figure 16:
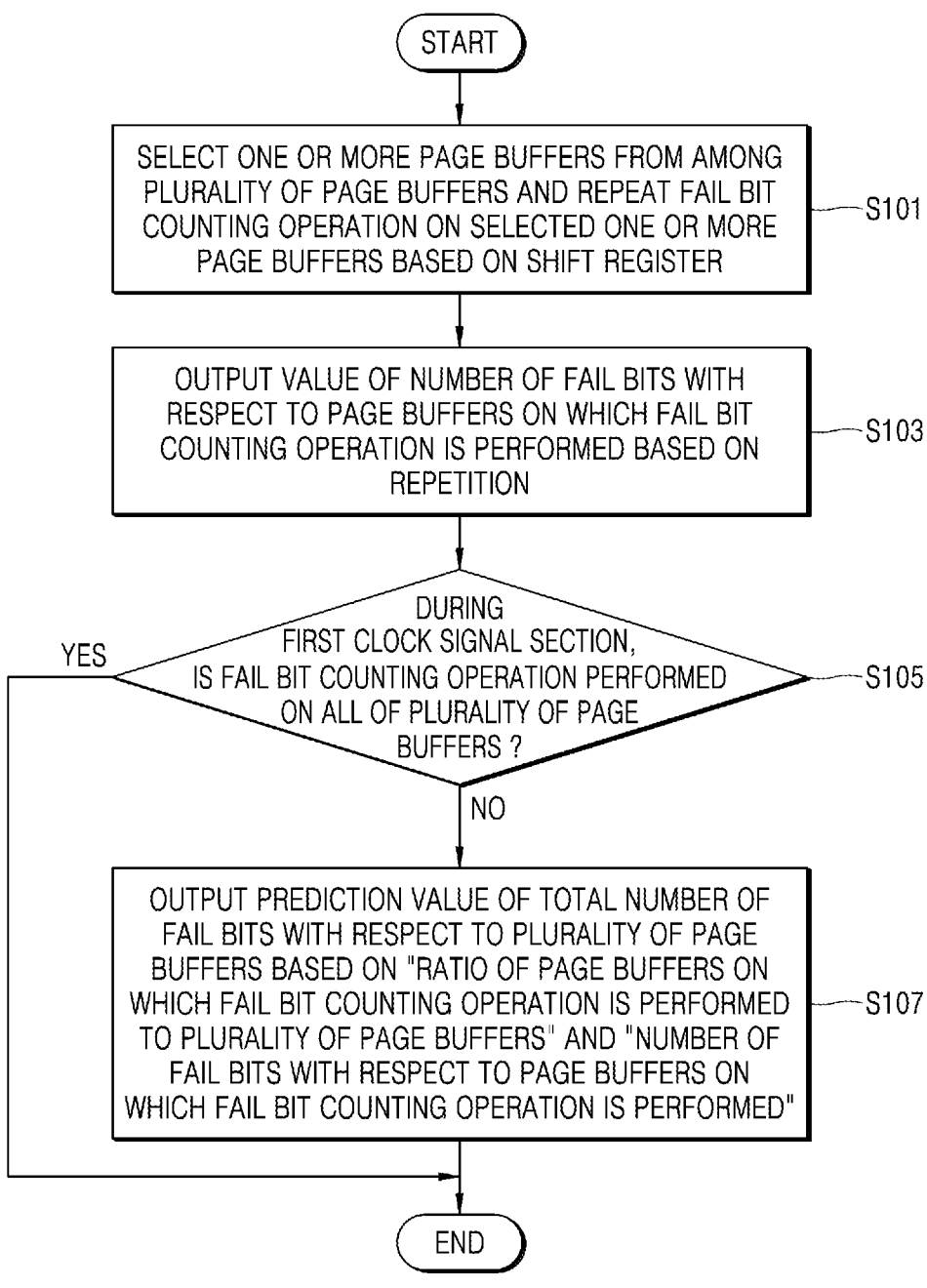
FIG. 16 illustrates an operation order of a memory device according to some embodiments.

FIG. 16 illustrates an operation order of the memory device 100 according to some embodiments.

Referring to FIG. 16, in operation S101, the memory device 100 may select one or more page buffers from among a plurality of page buffers and may repeat a fail bit counting operation on the selected one or more page buffers based on a shift register.

In operation S103, the memory device 100 may output a value of the number of fail bits with respect to the page buffers on which the fail bit counting operation is performed based on the repetition.

In operation S105, during a first clock signal section, the memory device 100 may identify whether or not the fail bit counting operation has been performed on all of the plurality of page buffers. During the first clock signal section, when the memory device 100 has performed the fail bit counting operation on all of the plurality of page buffers (YES branch from operation S105), the memory device 100 may end the fail bit counting operation. Otherwise, when the memory device 100 has performed the fail bit counting operation on only some of the plurality of page buffers (NO branch from operation S105), the memory device may perform operation S107.

In operation S107, during the first clock signal section, when the memory device 100 has performed the fail bit counting operation on only some of the plurality of page buffers (NO), the memory device 100 may output a prediction value of the total number of fail bits with respect to the plurality of page buffers, based on a ratio of the number of page buffers on which the fail bit counting operation is performed to the total number of the plurality of page buffers and the number of fail bits with respect to the page buffers on which the fail bit counting operation is performed.

The memory device 100 may output the prediction value and end the fail bit counting operation.

Figure 17:
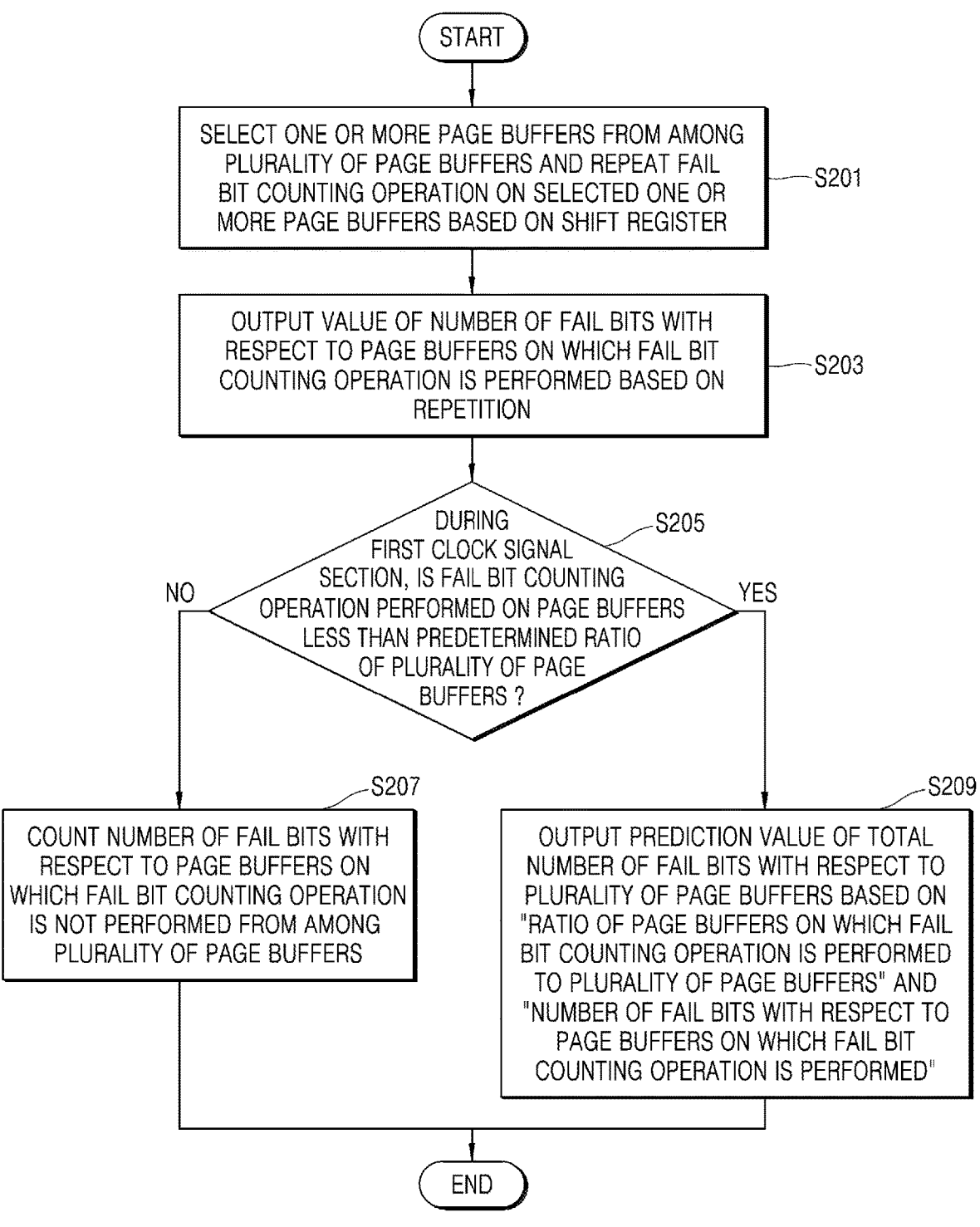
FIG. 17 illustrates an operation order of a memory device according to some embodiments.

FIG. 17 illustrates an operation order of the memory device 100 according to some embodiments.

Referring to FIG. 17, in operation S201, the memory device 100 may select one or more page buffers from among a plurality of page buffers and may repeat a fail bit counting operation on the selected one or more page buffers based on a shift register.

In operation S203, the memory device 100 may output a value of the number of fail bits with respect to the page buffers on which the fail bit counting operation is performed based on the repetition.

In operation S205, during a first clock signal section, the memory device 100 may identify whether or not a fail bit counting operation has been performed on page buffers less than a predetermined ratio of the plurality of page buffers. For example, the memory device 100 may identify whether or not the fail bit counting operation has been performed on the page buffers less than 60% of the plurality of page buffers. The ratio may be predetermined and is not limited to the embodiments described above. When the memory device 100 has not performed the fail bit counting operation on the page buffers less than the predetermined ratio of the plurality of page buffers (NO branch from operation S205), operation S207 may be performed. When the memory device 100 has performed the fail bit counting operation on the page buffers less than the predetermined ratio of the plurality of page buffers (YES branch from operation S205), operation S209 may be performed.

In operation S207, during the first clock signal section, when the memory device 100 has not performed the fail bit counting operation on the page buffers less than the predetermined ratio of the plurality of page buffers (NO), that is, when the memory device 100 has performed the fail bit counting operation on the page buffers equal to or greater than the predetermined ratio, the memory device 100 may count the number of fail bits with respect to the page buffers on which the fail bit counting operation has not been performed from among the plurality of page buffers. For example, when the memory device 100 has performed the fail bit counting operation on the page buffers of 60% or higher of the plurality of page buffers, the memory device 100 may perform the fail bit counting operation on the rest page buffers of 40%.

In operation S209, during the first clock signal section, when the memory device 100 has performed the fail bit counting operation on the page buffers less than the predetermined ratio of the plurality of page buffers (YES), the memory device 100 may output a prediction value of the total number of fail bits with respect to the plurality of page buffers, based on a ratio of the page buffers on which the fail bit counting operation is performed to the plurality of page buffers and the number of fail bits with respect to the page buffers on which the fail bit counting operation is performed. For example, when the memory device 100 has performed the fail bit counting operation on the page buffers less than 60% of the plurality of page buffers, the memory device 100 may output the prediction value of the total number of fail bits with respect to the plurality of page buffers (that is, the page buffers of 100%) based on 60% and a value of the number of fail bits with respect to the page buffers of 60%.

Figure 18:
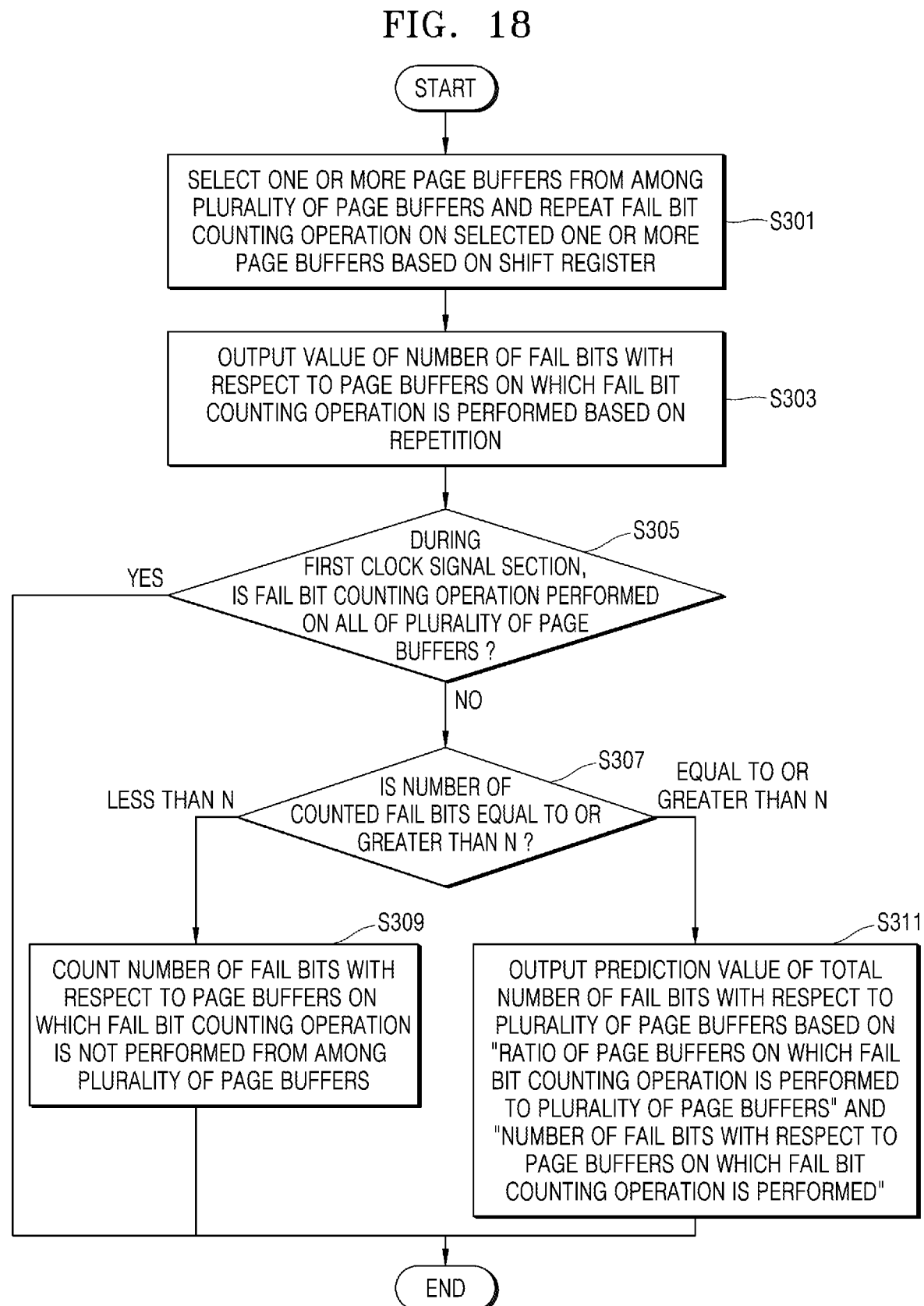
FIG. 18 illustrates an operation order of a memory device according to an embodiment.

FIG. 18 illustrates an operation order of the memory device 100 according to some embodiments.

Referring to FIG. 18, in operation S301, the memory device 100 may select one or more page buffers from among a plurality of page buffers and may repeat a fail bit counting operation on the selected one or more page buffers based on a shift register.

In operation S303, the memory device 100 may output a value of the number of fail bits with respect to the page buffers on which the fail bit counting operation is performed based on the repetition.

In operation S305, during a first clock signal section, the memory device 100 may identify whether or not the fail bit counting operation has been performed on all of the plurality of page buffers. During the first clock signal section, when the memory device 100 has performed the fail bit counting operation on all of the plurality of page buffers (YES branch from operation S305), the memory device 100 may end the fail bit counting operation. Otherwise (NO branch from operation S305), operation S307 may be performed.

In operation S307, during the first clock signal section, when the memory device 100 has performed the fail bit counting operation on only some of the plurality of page buffers (NO), the memory device 100 may identify whether or not the number of counted fail bits is equal to or greater than N.

In operation S309, when the number of counted fail bits is less than N, the memory device 100 may count the number of fail bits with respect to page buffers on which the fail bit counting operation has not been performed from among the plurality of page buffers.

In operation S311, when the number of counted fail bits is equal to or greater than N, the memory device 100 may output a prediction value of the total number of fail bits with respect to the plurality of page buffers, based on a ratio of the number of page buffers on which the fail bit counting operation is performed to the total number of the plurality of page buffers, and the number of fail bits with respect to the page buffers on which the fail bit counting operation is performed.

Figure 19:
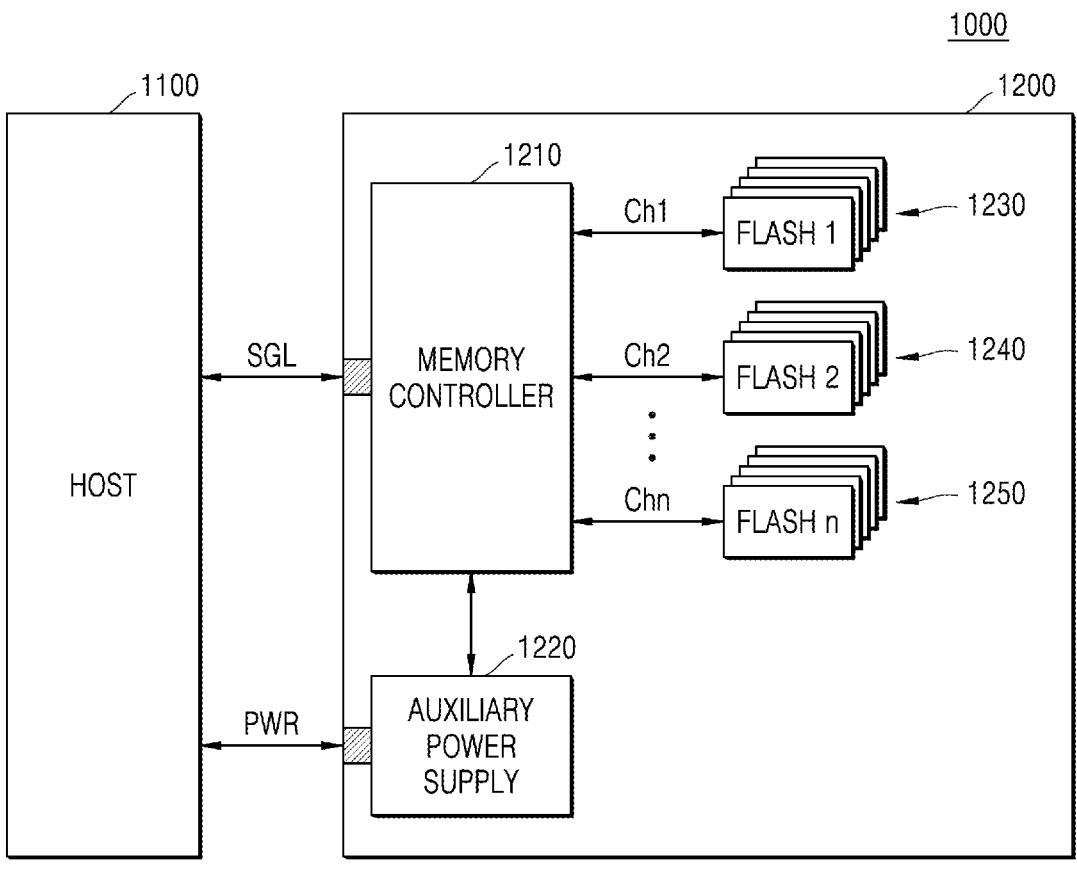
FIG. 19 is a block diagram of a solid state drive (SSD) system according to an embodiment.

FIG. 19 is a block diagram of an SSD system 1000 according to some embodiments.

Referring to FIG. 19, the SSD system 1000 may include a host 1100 and an SSD 1200. The SSD 1200 may exchange a signal SGL with the host 1100 through a signal connector and may receive a power supply PWR through a power connector. The SSD 1200 may include a memory controller 1210, an auxiliary power supply 1220, and a plurality of memory devices 1230, 1240, and 1250.

The plurality of memory devices 1230, 1240, and 1250 may be connected to the memory controller 1210 and channels Ch1 to Chn and may perform the fail bit counting operation according to some embodiments. Specifically, the plurality of memory devices 1230, 1240, and 1250 may include the prediction-based fail bit counter 600 (see FIG. 1) and the page buffer selection control circuit 650 (see FIG. 1) according to some embodiments.

While the inventive concepts have been particularly shown and described with reference to some examples of embodiments thereof, it will be understood that various changes in form and details may be made therein without departing from the scope of the following claims.

What is claimed is:

1. A nonvolatile memory device comprising:
a memory cell array including a plurality of memory cells;
a plurality of page buffers connected to the memory cell array through bit lines;
a control logic configured to generate a clock signal and a page buffer selection signal, the page buffer selection signal including information about a ratio of a number of page buffers on which a fail bit counting operation is performed to a total number of the plurality of page buffers;
a fail bit counting circuit configured to:
select, based on the clock signal and the page buffer selection signal, one or more page buffers from among the plurality of page buffers,
repeat, based on a shift register, the fail bit counting operation on the selected one or more page buffers, and
output a value of a number of fail bits with respect to the selected one or more page buffers on which the fail bit counting operation is performed based on the repetition; and
a predictor configured to generate, based on the ratio of the number of page buffers on which the fail bit counting operation is performed to the total number of the plurality of page buffers and based on the number of fail bits with respect to the selected one or more page buffers on which the fail bit counting operation is performed, a prediction value with respect to a total number of fail bits with respect to the plurality of page buffers.

2. The nonvolatile memory device of claim 1, wherein the fail bit counting circuit includes at least one of a page buffer selector, a fail bit counter, and the shift register.

3. The nonvolatile memory device of claim 2, wherein the page buffer selector is configured to:
receive the page buffer selection signal and, in response to the page buffer selection signal, select the one or more page buffers from among the plurality of page buffers; and
output, from each of the selected one or more page buffers, data to the shift register.

4. The nonvolatile memory device of claim 3, wherein the shift register includes one or more D flip-flops and one or more multiplexers,
wherein the shift register is configured to receive the data from the page buffer selector, and when the data is a pass bit, pass the one or more D flip-flops through the one or more multiplexers, and when the data is a fail bit, receive the clock signal from the control logic, and
wherein the shift register is further configured to generate, from the data, a scan output signal by using the clock signal, the one or more D flip-flops, and the one or more multiplexers,
wherein a number of rising edges of the clock signal during a section in which the scan output signal has a logic high level is equal to the number of fail bits.

5. The nonvolatile memory device of claim 4, wherein the fail bit counter is configured to receive the scan output signal from the shift register and, based on the scan output signal, output the value of the number of fail bits with respect to the selected one or more page buffers.

6. The nonvolatile memory device of claim 5, wherein the predictor is configured to receive the page buffer selection signal from the control logic and the value of the number of fail bits with respect to the selected one or more page buffers from the fail bit counter.

7. The nonvolatile memory device of claim 1, wherein the predictor is configured to, during a first clock signal section, generate the prediction value, when the fail bit counting operation is performed on only some of the plurality of page buffers based on the repetition of the fail bit counting operation on the selected one or more page buffers.

8. The nonvolatile memory device of claim 7, wherein the predictor is further configured to refrain from generation, during the first clock signal section, of the prediction value when the fail bit counting operation is performed on all of the plurality of page buffers based on the repetition of the fail bit counting operation on the selected one or more page buffers.

9. A nonvolatile memory device comprising:
a memory cell array including a plurality of memory cells;
a plurality of page buffers connected to the memory cell array through bit lines;
a control logic configured to generate a clock signal;
a page buffer selection signal control circuit configured to generate a page buffer selection signal including information about a ratio of a number of page buffers on which a fail bit counting operation is performed to a total number of the plurality of page buffers;
a fail bit counting circuit configured to: select, based on the clock signal and the page buffer selection signal, one or more page buffers from among the plurality of page buffers, repeat, based on a shift register, the fail bit counting operation on the selected one or more page buffers, and output a value of a number of fail bits with respect to the selected one or more page buffers on which the fail bit counting operation is performed based on the repetition; and
a predictor configured to generate, based on the ratio of the number of page buffers on which the fail bit counting operation is performed to the total number of the plurality of page buffers and the number of fail bits with respect to the selected one or more page buffers on which the fail bit counting operation is performed, a prediction value with respect to a total number of fail bits with respect to the plurality of page buffers.

10. An operating method of a nonvolatile memory device including a plurality of page buffers, the operating method comprising:

selecting one or more page buffers from among the plurality of page buffers and repeating a fail bit counting operation on the selected one or more page buffers based on a shift register;

generating a value of a number of fail bits with respect to the selected one or more page buffers on which the fail bit counting operation is performed based on the repetition; and generating, based on a ratio of a number of the selected one or more page buffers on which the fail bit counting operation is performed to a total number of the plurality of page buffers and the number of fail bits with respect to the selected one or more page buffers on which the fail bit counting operation is performed, a prediction value with respect to a total number of fail bits with respect to the plurality of page buffers.

11. The operating method of claim 10, wherein the generating of the prediction value includes, during a first clock signal section, generating the prediction value when the fail bit counting operation is performed on only some of the plurality of page buffers based on the repetition of the fail bit counting operation on the selected one or more page buffers.

12. The operating method of claim 11, further comprising, during the first clock signal section, refraining from generating the prediction value when the fail bit counting operation is performed on all of the plurality of page buffers based on the repetition of the fail bit counting operation on the selected one or more page buffers.

13. The operating method of claim 10, wherein the generating of the prediction value includes, during a first clock signal section, generating the prediction value when the fail bit counting operation is performed on only some of the plurality of page buffers based on the repetition of the fail bit counting operation on the selected one or more page buffers, and based on a number of counted fail bits being greater than or equal to a predetermined number.

14. The operating method of claim 13, further comprising, during the first clock signal section, refraining from generating the prediction value when the fail bit counting operation is performed on only some of the plurality of page buffers based on the repetition of the fail bit counting operation on the selected one or more page buffers, and based on the number of counted fail bits being less than the predetermined number.

15. The operating method of claim 13, further comprising, during the first clock signal section, refraining from generating the prediction value when the fail bit counting operation is performed on all of the plurality of page buffers based on the repetition of the fail bit counting operation on the selected one or more page buffers.

16. The operating method of claim 10, wherein the shift register includes a D flip-flop and a multiplexer through which the D flip-flop is passed with respect to a pass bit.

17. The operating method of claim 10, wherein, with respect to the fail bit counting operation on the selected one or more page buffers based on the shift register, a number of rising edges of a clock signal during a section in which a scan output signal has a logic high level is equal to the number of fail bits.

18. The operating method of claim 10, wherein the selecting of the one or more page buffers from among the plurality of page buffers includes dividing the plurality of page buffers into a predetermined number of groups and selecting at least one page buffer for each group.

19. The operating method of claim 18, wherein the ratio of the number of the selected one or more page buffers on which the fail bit counting operation is performed to the total number of the plurality of page buffers corresponds to a ratio of the at least one page buffer selected for each group to total page buffers of each group.

20. The operating method of claim 10, further comprising applying at least one of a program voltage, an erase voltage, and a read voltage to a memory cell array of the nonvolatile memory device based on at least one of the value of the number of fail bits and the prediction value.

* * * * *